United States Patent
Kato

(10) Patent No.: US 11,519,067 B2
(45) Date of Patent: Dec. 6, 2022

(54) METHOD FOR DEPOSITING A SILICON NITRIDE FILM AND FILM DEPOSITION APPARATUS

(71) Applicant: Tokyo Electron Limited, Tokyo (JP)

(72) Inventor: Hitoshi Kato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 279 days.

(21) Appl. No.: 16/516,395

(22) Filed: Jul. 19, 2019

(65) Prior Publication Data
US 2020/0032390 A1 Jan. 30, 2020

(30) Foreign Application Priority Data
Jul. 27, 2018 (JP) .............................. JP2018-141736

(51) Int. Cl.
| | |
|---|---|
| *C23C 16/34* | (2006.01) |
| *H01L 21/02* | (2006.01) |
| *C23C 16/455* | (2006.01) |
| *H01J 37/32* | (2006.01) |

(52) U.S. Cl.
CPC ...... *C23C 16/345* (2013.01); *C23C 16/45538* (2013.01); *C23C 16/45544* (2013.01); *H01J 37/32357* (2013.01); *H01L 21/0217* (2013.01); *H01L 21/0228* (2013.01); *H01J 2237/3321* (2013.01)

(58) Field of Classification Search
CPC ........... H01L 21/02211; H01L 21/0217; C23C 16/345; C23C 16/45544
See application file for complete search history.

(56) References Cited

U.S. PATENT DOCUMENTS

| | | | | |
|---|---|---|---|---|
| 2007/0090358 A1* | 4/2007 | Kanno | ............... | H01L 27/1285 257/59 |
| 2007/0269982 A1* | 11/2007 | Rocklein | ............... | C23C 16/44 438/680 |
| 2014/0209562 A1* | 7/2014 | LaVoie | ............. | H01L 21/02274 216/2 |
| 2014/0213037 A1* | 7/2014 | LiCausi | ............. | H01L 21/3105 438/429 |
| 2017/0125238 A1* | 5/2017 | Hasebe | ............... | H01L 21/0228 |

FOREIGN PATENT DOCUMENTS

| | | |
|---|---|---|
| JP | 2018-010950 | 1/2018 |
| TW | 201617471 | 5/2016 |

\* cited by examiner

*Primary Examiner* — Joseph A Miller, Jr.
(74) *Attorney, Agent, or Firm* — IPUSA, PLLC

(57) ABSTRACT

A method for depositing a silicon nitride film is provided. A silicon nitride film is deposited in a depression formed in a surface of a substrate from a bottom surface and a lateral surface by ALD toward a center of the depression in a lateral direction so as to narrow a space at the center of the depression. First nitrogen radicals are adsorbed into the depression immediately before a stage of filling the space at the center with the silicon nitride film deposited toward the center of the depression. A silicon-containing gas is adsorbed on the first nitrogen radical in the depression by physical adsorption. Second nitrogen radicals are supplied into the depression so as to release the silicon-containing gas from the first nitrogen radical and to cause the released silicon-containing gas to react with the second nitrogen radical, thereby depositing a silicon nitride film to fill the central space.

6 Claims, 15 Drawing Sheets

METHOD FOR DEPOSITING A SILICON NITRIDE FILM AND FILM DEPOSITION APPARATUS

CROSS-REFERENCE TO RELATED APPLICATION

The present application is based on and claims priority to Japanese Application No. 2018-141736 filed on Jul. 27, 2018, the entire contents of which are hereby incorporated herein by reference.

BACKGROUND OF THE INVENTION

1. Field of the Invention

The present disclosure relates to a method for depositing a silicon nitride film and a film deposition apparatus.

2. Description of the Related Art

Conventionally, as disclosed in Japanese Laid-Open Patent Application Publication No. 2018-10950, a method for depositing a silicon nitride film is known that can form an, open cross-sectional shape of a V-shaped aperture while performing filling deposition with preferable filling characteristics.

The method for forming the silicon nitride film described in Japanese Laid-Open Patent Application Publication No. 2018-10950 includes steps of: supplying an ammonia-containing gas to a substrate having a surface depression formed therein; nitriding a surface of the depression to form an adsorption site in the depression; and supplying a chlorine-containing gas to the substrate to physically adsorb the chlorine-containing gas to a predetermined region from the top of the depression to a predetermined depth to form a non-adsorption site in the predetermined region. Then, a silicon-containing gas is supplied to the substrate; the silicon-containing gas is adsorbed on the adsorption site that is the remaining region other than the predetermined region including a bottom portion in the depression; and a silicon nitride film is deposited by reaction between the ammonia-containing gas and a silicon-containing gas.

According to the method for depositing the silicon nitride film described in Japanese Laid-Open Patent Application Publication No. 2018-10950, depositing the film into the depression can be performed while maintaining the V-shaped cross-sectional shape, and the generation of voids can be reduced by bottom-up deposition.

When a depression such as a trench and a via is filled with a film using ALD (Atomic Layer Deposition, Atomic Layer Deposition), a layer of film is deposited from the inner side surface toward the center of the depression. Finally, the space is filled with the film by connecting the opposing thin films to each other, and even when the generation of voids is reduced, a seam may remain.

Accordingly, the present disclosure provides a method for depositing a silicon nitride film and a film deposition apparatus that can inhibit the generation of a seam at a final stage of filling.

SUMMARY OF THE INVENTION

In order to accomplish the above-described purpose, the method for depositing the silicon nitride film according to one aspect of the present disclosure includes a step of gradually filling a depression formed in a surface of the substrate with a silicon nitride film by ALD from the bottom surface and the side surface, and depositing a thin film from the side surface to the center so as to narrow the space in the center part of the depression.

According to an embodiment of the disclosure, there is provided a method for depositing a silicon nitride film. In the method, a silicon nitride film is deposited in a depression formed in a surface of a substrate from a bottom surface and a lateral surface by ALD toward a center of the depression in a lateral direction so as to narrow a space at the center of the depression. A first nitrogen radical is adsorbed into the depression immediately before a stage of filling the space at the center with the silicon nitride film deposited toward the center of the depression. A silicon-containing gas is adsorbed on the first nitrogen radical in the depression by physical adsorption. A second nitrogen radical is supplied into the depression so as to release the silicon-containing gas from the first nitrogen radical and to cause the released silicon-containing gas to react with the second nitrogen radical, thereby depositing a silicon nitride film to fill the space at the center.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Embodiments of the present disclosure are described below with reference to the accompanying drawings.

[Film Deposition Apparatus]

Figure 1:
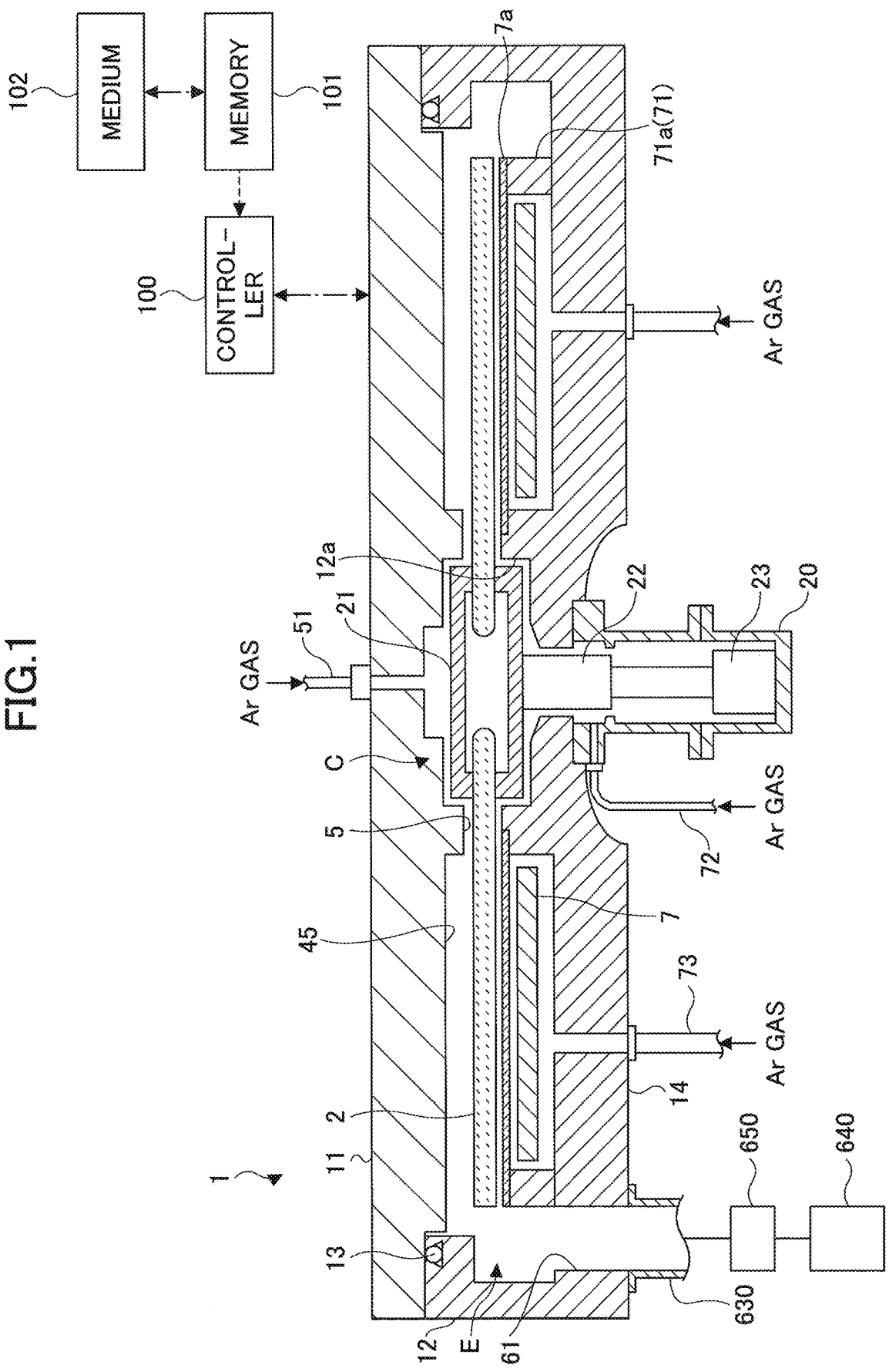
FIG. 1 a schematic cross-sectional view illustrating a film deposition apparatus according to an embodiment of the present disclosure.
Figure 2:
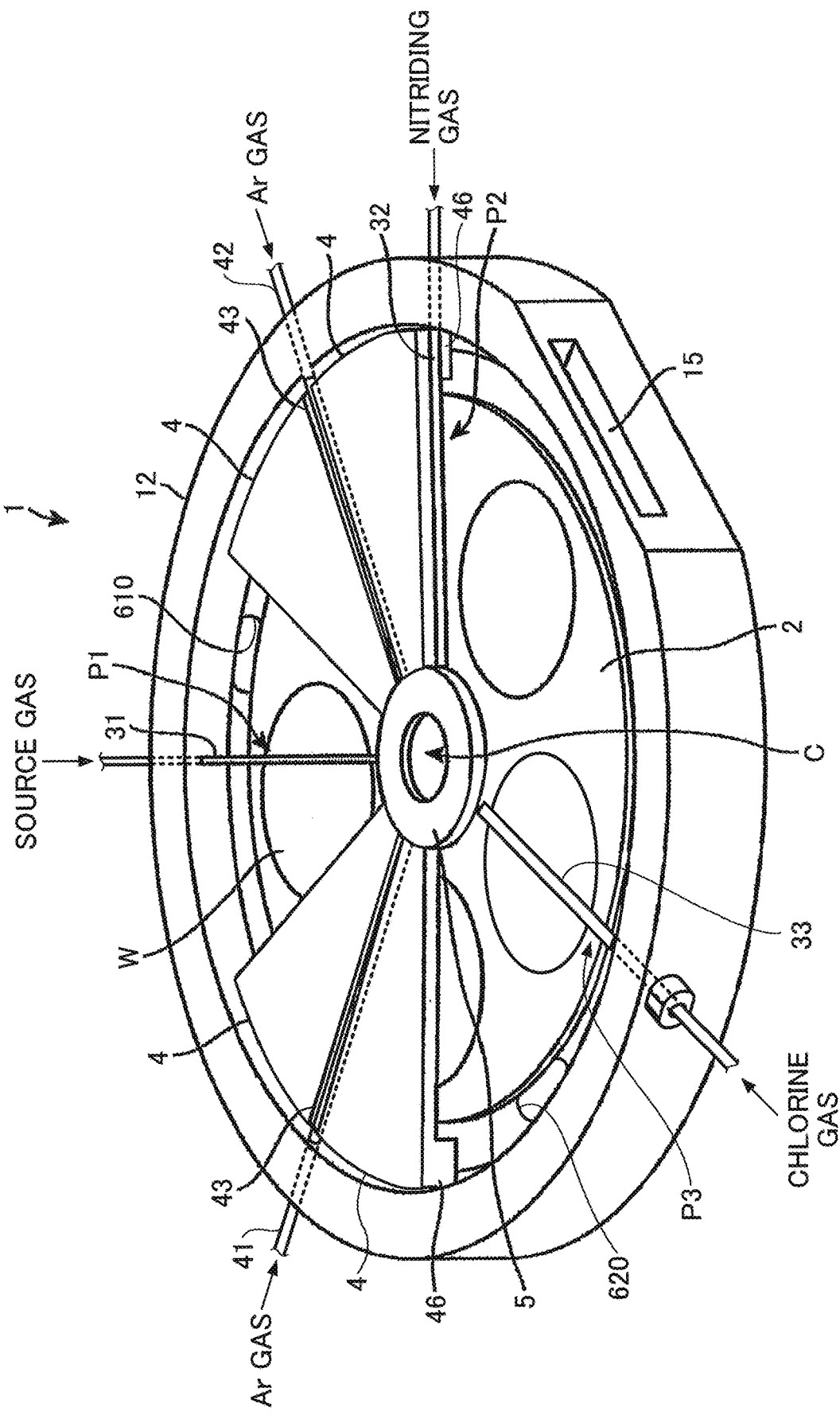
FIG. 2 is a schematic perspective view illustrating an inner structure of a vacuum chamber of a film deposition apparatus according to an embodiment of the present disclosure.
Figure 3:
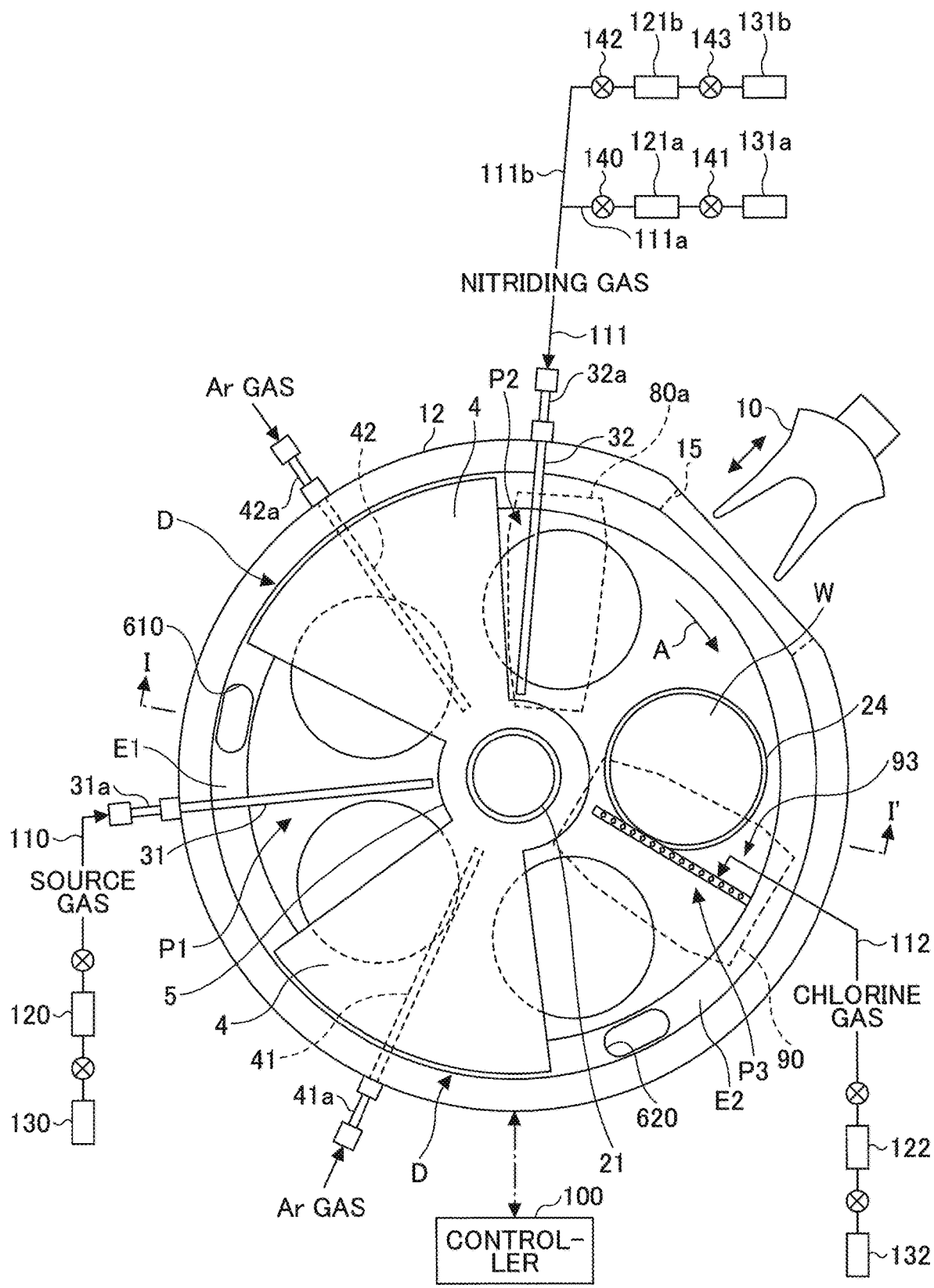
FIG. 3 is a schematic plan view illustrating an inner structure of a vacuum chamber of a film deposition apparatus according to an embodiment of the present disclosure.

To begin with, a film deposition apparatus according to an embodiment of the present disclosure is described below. With reference to FIGS. 1 through 3, the film deposition apparatus includes a vacuum chamber 1 having a substantially flat circular shape, and a turntable 2 having a rotational axis coincident with the center of the vacuum chamber 1. The vacuum chamber 1 is a process chamber to accommodate a wafer therein and to deposit a film on a surface of the wafer. The vacuum chamber 1 includes a chamber body 12 having a cylindrical shape with a bottom surface, and a ceiling plate 11 placed on the upper surface of the chamber body 12. The ceiling plate 11 is detachably placed on the chamber body 12 via a sealing member 13 (FIG. 1) such as an O-ring in an airtight manner.

The turntable 2 is provided in the vacuum chamber 1. The turntable 2 is attached to a cylindrical shaped core unit 21 at its center portion. The core unit 21 is fixed to the upper end of a rotary shaft 22 that extends in the vertical direction. The rotary shaft 22 is provided to penetrate through a bottom portion 14 of the vacuum chamber 1, and the lower end of the rotary shaft 22 is attached to a driving unit 23 that rotates the rotary shaft 22 (FIG. 1) about a vertical axis. The rotary shaft 22 and the driving unit 23 are housed in the cylindrical case body 20 whose upper surface is open. The case body 20 is attached to a lower surface of the bottom portion 14 of the vacuum chamber 1 via a flange portion provided at its upper surface in an airtight manner so that inner atmosphere of the case body 20 is isolated from external atmosphere.

As illustrated in FIGS. 2 and 3, a plurality of (five in the example of the drawing) circular concave portions 24 is provided in a top surface of the turntable 2 along a rotating direction (circumferential direction) to receive the plurality of semiconductor wafers (which will be simply referred to as "wafers" hereinafter) W, respectively. In FIG. 3, only a single wafer W is illustrated in one of the concave portions 24 for an explanatory purpose. Each of the concave portions 24 is formed to have a slightly larger (for example, 4 mm larger) diameter than that (for example, 300 mm) of the wafer W, and to have a depth substantially equal to the thickness of the wafer W. Thus, when the wafer W is placed in the respective concave portion 24, the surface of the wafer W and the surface of the turntable 2 (where the wafer W is not placed) become almost the same height. Each of the concave portions 24 has three, for example, through holes formed in the bottom, through which lift pins for supporting a back surface of the respective wafer W and lifting the wafer W penetrate.

FIGS. 2 and 3 are diagrams for explaining an inner structure of the vacuum chamber 1. The ceiling plate 11 is not illustrated in FIGS. 2 and 3 for an explanatory purpose. As illustrated in FIGS. 2 and 3, a reaction gas nozzle 31, a reaction gas nozzle 32, a showerhead 93, and separation gas nozzles 41 and 42, which are made of quartz, for example, are disposed above the turntable 2. In the example illustrated in FIG. 3, the showerhead 93, the separation gas nozzle 41, the reaction gas nozzle 31, the separation gas nozzle 42, and the reaction gas nozzle 32 are disposed in this order from a transfer port 15 (which will be explained later) in a clockwise direction (the rotation direction of the turntable 2 as illustrated by an arrow A in FIG. 3) with a space therebetween in a circumferential direction of the vacuum chamber 1. Gas introduction ports 31a, 32a, 33a, 41a, and 42a (FIG. 3) that are base portions of the nozzles 31, 32, 33, 41, and 42, respectively, are fixed to an outer peripheral wall of the chamber body 12 so that these nozzles 31, 32, 41, and 42 are introduced into the vacuum chamber 1 from the outer peripheral wall of the vacuum chamber 1 so as to extend in a radial direction and parallel to the surface of the turntable 2. The showerhead 93 is also a gas introduction port (not illustrated) on the top surface of the top plate 11, which is not illustrated. Details of the configuration of the showerhead 93 will be described later.

In this embodiment, as illustrated in FIG. 3, the reaction gas nozzle 31 is connected to a supply source 130 (not illustrated in the drawings) of a source gas via a pipe 110, a flow controller 120 and the like (not illustrated in the drawings). The reaction gas nozzle 32 is connected to a supply source 131 (not illustrated in the drawings) of a nitriding gas via pipes 111, 111a, 111b, and flow controllers 121a, 121b and the like (not illustrated in the drawings). Whether ammonia gas or nitrogen gas is used as the nitriding gas is configured to be switchable by valves 140-143. Further, the showerhead 93 is connected to a source 132 of chlorine gas ($Cl_2$) via a pipe 112 and a flow controller 122 or the like. Both separation gas nozzles 41 and 42 are connected to a source of separation gas (not illustrated), such as piping and flow control valves (not illustrated). As the separation gas, a noble gas such as helium (He) or argon (Ar) or an inert gas such as nitrogen ($N_2$) gas can be used. In this embodiment, an example of using Ar gas is described below.

Each of the reaction gas nozzles 31, 32 has a plurality of gas discharge holes 35 (see FIG. 4) that faces downward to the turntable 2 along the longitudinal directions of each of the reaction gas nozzles 31, 32 at intervals of 10 mm, for example. A region below the reaction gas nozzle 31 is a first process region P1 in which the source gas adsorbs on the wafers W. A region below the reaction gas nozzle 32 is a second process region P2 in which the nitriding gas that nitrides the source gas adsorbed on the wafer W is supplied, thereby producing a molecular layer of a nitride. The molecular layer of the nitride forms a film to be deposited. A region below the showerhead 93 is a third process region P3 in which chlorine gas activated by plasma is supplied to the reaction product (nitride film) produced in the second process region P2, thereby forming an adsorption blocking group. Here, because the first process region P1 is a region to supply the source gas to the wafer to and to adsorb the source gas on the wafer W, the first process region P1 may be referred to as a source gas supply region or a source gas adsorption region P1. Similarly, because the second process region P2 is a region to supply the nitriding gas that reacts with the source gas and produces the nitride, the second process region P2 may be referred to as a nitriding gas supply region or a nitriding region P2. Also, because the third process region P3 is a region to supply chlorine gas and to adsorb chlorine gas on the wafer W, the third process region P3 may be referred to as a chlorine gas supply region or a chlorine adsorbing region P3.

A remote plasma generator 90 is provided above the third process region P3 as necessary. A plasma generator 80 is also provided above the second process region P2, as necessary. In FIG. 3, plasma generators 80, 90 are illustrated in a simplified manner with dashed lines. Details of the plasma generators 80, 90 are described below.

As the raw material gas, a gas containing silicon, or preferably a gas containing silicon and chlorine is selected. For example, a gas containing silicon and chlorine such as dichlorosilane (DCS, $SiH_2Cl_2$) is selected as the raw material gas.

As the nitriding gas, when a depression is filled with a silicon nitride film while maintaining a V-shaped cross-sectional shape, an ammonia (NH3) containing gas is selected. The nitrogen ($N_2$) containing gas is then selected when the space in the center of the silicon nitride film deposited in the depression is seamlessly filled. In addition to ammonia or nitrogen, the nitride gas may include a carrier gas such as Ar.

The chlorine gas supplied from the showerhead 93 has a role of forming an adsorption inhibiting region on the surface of the wafer consisting of an adsorption inhibitor that inhibits the adsorption of the source gas supplied from the first reaction gas nozzle 31 to the wafer W. For example, when a depression pattern, such as a via or a trench, is formed in the surface of the wafer W, by forming an adsorption inhibiting region consisting of an adsorption inhibiting group on the top surface of the wafer W and the upper portion of the depression pattern, the film on the upper portion of the depression pattern is not thick, and the film on the bottom surface is thick, thereby enabling the film deposition with a high bottom-up property. By nitriding the source gas, the source gas is terminated with an amino group having the $NH_2$ structure that forms an adsorption site for the source gas, but when activated chlorine is supplied, the H group in the $NH_2$ structure is replaced by a Cl group. As described above, because the source gas is a chlorine-containing gas and because chlorine does not adsorb to each other, the source gas does not adsorb on the chlorine-terminated part. Thus, the location terminated with the Cl group serves as an adsorption inhibitor and inhibits the adsorption of the source gas. Because the activated chlorine gas readily reaches the top surface of the wafer W and the upper portion of the depression pattern, many of the activated chlorine gas adsorbs on the top surface of the wafer W and the upper portion of the depression pattern. In contrast, because the activated chlorine is unlikely to reach the lower portion and the bottom portion of the depression pattern, the density of the chlorine groups decreases with the decreasing distance from the bottom portion of the depression pattern. Accordingly, adsorption inhibiting groups are formed at high density on the top surface of the wafer and the upper portion of the depression pattern, while adsorption inhibiting groups are formed at low density at the lower portion (bottom portion) of the depression pattern. Thus, the source gas can be adsorbed more on the lower portion than the top surface of the wafer W and the upper portion of the depression pattern, and bottom-up deposition that starts depositing from the bottom portion of the depression pattern can be achieved. Details of this point will be described later. The gas supplied from the showerhead may contain a carrier gas such as Ar, in addition to chlorine gas.

Referring to FIGS. 2 and 3, the ceiling plate 11 includes two convex portions 4 in the vacuum chamber 1. As will be explained below, the convex portions 4 are attached to a lower surface of the ceiling plate 11 so as to protrude toward the turntable 2 to form separation regions D with the corresponding separation gas nozzles 41 and 42. Each of the convex portions 4 has substantially a fan-like planar shape where the apex is removed in an arc shape. For each of the convex portions 4, the inner arc shaped portion is connected to a protruding portion 5 (which will be explained below) and the outer arc shaped portion is formed to extend along an inner peripheral surface of the chamber body 12 of the vacuum chamber 1.

Figure 4:
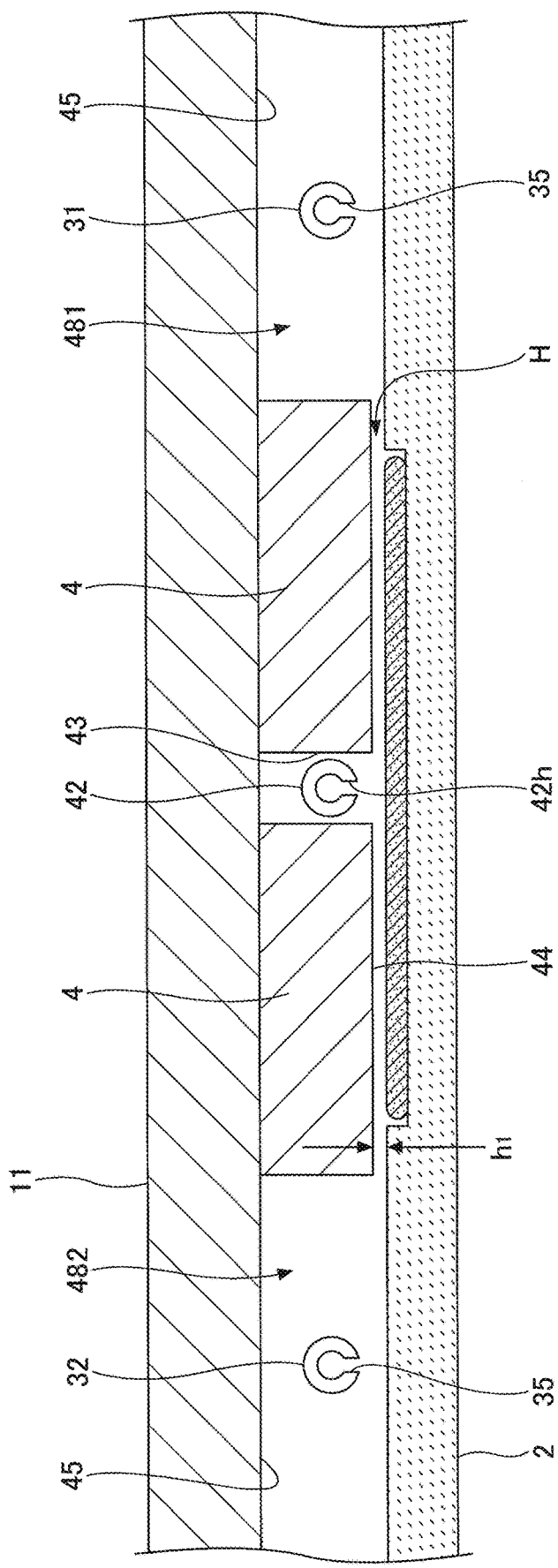
FIG. 4 is a schematic partial cross-sectional view of a vacuum chamber of a film deposition apparatus according to an embodiment of the present disclosure taken along a concentric circle of a turntable.

FIG. 4 illustrates a cross-section of the vacuum chamber 1 along a concentric circle of the turntable 2 from the reaction gas nozzle 31 to the reaction gas nozzle 32. As illustrated in FIG. 4, the convex portion 4 is fixed to the lower surface of the ceiling plate 11. Thus, the vacuum chamber 1 includes a flat low ceiling surface 44 (first ceiling surface) formed as the lower surface of the convex portion 4, and flat higher ceiling surfaces 45 (second ceiling surfaces) which are higher than the low ceiling surface 44 and formed on both sides of the low ceiling surface 44 in the circumferential direction. The low ceiling surface 44 has substantially a fan-like planar shape where the apex is removed in an arc shape. Furthermore, as illustrated in the drawings, the convex portion 4 includes a groove portion 43 at a center in the circumferential direction. The groove portion 43 is formed to extend in the radial direction of the turntable 2. The separation gas nozzle 42 is housed in the groove portion 43. Although not illustrated in FIG. 4, the separation gas nozzle 41 is also housed in a groove portion provided in the other convex portion 4. The reaction gas nozzles 31 and 32 are provided in spaces below the high ceiling surfaces 45, respectively. The reaction gas nozzles 31 and 32 are provided in the vicinity of the wafers W apart from the high ceiling surfaces 45, respectively. Here, the reaction gas nozzle 31 is disposed in a space 481 below and on the right side of the high ceiling surface 45, and the reaction gas nozzle 32 is disposed in a space 482 below and on the left side of the high ceiling surface 45.

Each of the separation gas nozzles 41 and 42 has a plurality of gas discharge holes 42h (see FIG. 4) formed along the lengthwise direction thereof at a predetermined interval (10 mm, for example).

The low ceiling surface 44 provides a separation space H, which is a narrow space, with respect to the turntable 2. When Ar gas is supplied from the separation gas nozzle 42 to the separation space H, this Ar gas flows toward the space 481 and the space 482 through the separation space H. On this occasion, because the volume of the separation space H is smaller than those of the spaces 481 and 482, the pressure in the separation space H can be made higher than those in the spaces 481 and 482 by Ar gas. It means that the separation space H having the higher pressure is formed between the spaces 481 and 482. Moreover, Ar gas flowing from the separation space H toward the spaces 481 and 482 serves as a counter flow against the source gas from the gas first process region P1 and the nitriding gas from the second process region P2. Thus, the source gas from the first process region P1 is separated from the nitriding gas from the second process region P2 by the separation space H. Therefore, mixing and reacting of the source gas with the nitriding gas are prevented in the vacuum chamber 1.

The height h1 of the low ceiling surface 44 above an upper surface of the turntable 2 is preferred to be appropriately determined based on the pressure of the vacuum chamber 1 during the film deposition, the rotational speed of the turntable 2, and a supplying amount of the separation gas (Ar gas) in order to maintain the pressure in the separation space H higher than those in the spaces 481 and 482.

Referring to FIGS. 1 through 3, the ceiling plate 11 further includes the protruding portion 5 at its lower surface to surround the outer periphery of the core unit 21 that supports the turntable 2. The protruding portion 5 is continuously formed with the inner portions of the convex portions 4 and has a lower surface that is formed at the same height as those of the low ceiling surfaces 44, in this embodiment.

Figure 5:
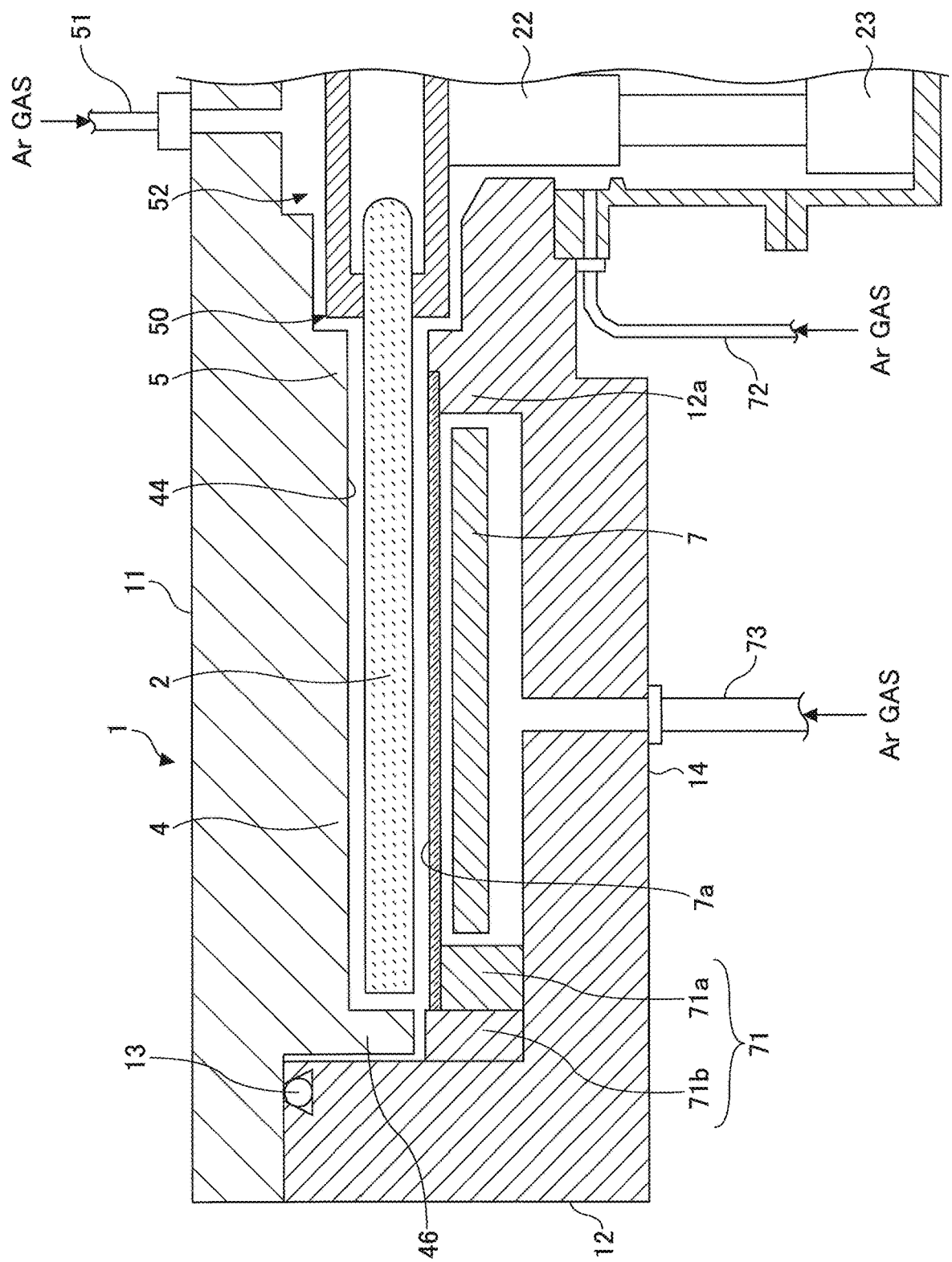
FIG. 5 is another schematic cross-sectional view of a film deposition apparatus according to an embodiment of the present disclosure.

FIG. 1 is a cross-sectional view taken along an I-I' line in FIG. 3, and illustrating an area where the ceiling surface 45 is provided. FIG. 5 is a partial cross-sectional view illustrating an area where the ceiling surface 44 is provided. As illustrated in FIG. 5, the convex portion 4 having a substantially fan-like planar shape includes an outer bending portion 46 at its outer peripheral end portion (at an outer peripheral end portion side of the vacuum chamber 1) which is bent to have an L-shape to face an outer end surface of the turntable 2. The outer bending portion 46 inhibits a flow of gas between the space 481 and the space 482 through the space between the turntable 2 and the inner peripheral surface of the chamber body 12. As described above, the convex portions 4 are disposed on the ceiling plate 11 which is detachably attached to the chamber body 12. Thus, a slight space is provided between the outer periphery surface of the outer bending portion 46 and the chamber body 12. The spaces between the inner periphery surface of the outer bending portion 46 and an outer surface of the turntable 2, and the space between the outer periphery surface of the outer bending portion 46 and the chamber body 12 are set at the same size as the height h1 (see FIG. 4) of the low ceiling surface 44 with respect to the upper surface of the turntable 2, for example.

As illustrated in FIG. 5, the inner peripheral wall of the chamber body 12 is disposed to extend in a vertical direction to be closer to the outer peripheral surface of the outer bending portion 46 at the separation region H. However, other than the separation region H, as illustrated in FIG. 1, for example, the inner peripheral wall of the chamber body 12 is recessed outward in a range from a location facing the outer end surface of the turntable 2 to the upper end of the bottom portion 14. Hereinafter, for an explanatory purpose, the concave portion, having a substantially rectangular cross-sectional view, is referred to as an "evacuation region." Specifically, a part of the evacuation region which is in communication with the first process region P1 is referred to as a first evacuation region E1, and a part of the evacuation region which is in communication with the second and third process regions P2 and P3 is referred to as a second evacuation region E2. As illustrated in FIGS. 1 through 3, a first evacuation port 610 and a second evacuation port 620 are respectively disposed at the bottom portions of the first evacuation region E1 and the second evacuation region E2. The first evacuation port 610 and the second evacuation port 620 are connected to vacuum pumps 640, which are vacuum evacuation units, via evacuation pipes 630, respectively, as illustrated in FIG. 1. Moreover, a pressure controller 650 is disposed between the vacuum pumps 640 and the evacuation pipes 630 in FIG. 1.

As illustrated in FIGS. 1 and 5, a heater unit 7, which is a heating device, is disposed in a space between the bottom portion 14 of the vacuum chamber 1 and the turntable 2, and heats a wafer W on the turntable 2 via the turntable 2 up to a temperature determined by a process recipe (e.g., 400° C.). As illustrated in FIG. 5, a ring-shaped cover member 71 is disposed below, at and near the periphery of the turntable 2 to prevent a gas from entering an area under the turntable 2 by separating an atmosphere from a space above the turntable 2 to the evacuation regions E1 and E2 from an atmosphere in which the heater unit 7 is placed. The cover member 71 includes an inner member 71a disposed under the periphery and outside of the turntable 2 and an outer member 71b disposed between the inner member 71a and the inner side wall of the vacuum chamber 1. The outer member 71b is disposed to face the outer bending portion 46, which is formed at an outer edge portion at lower side of each of the convex portions 4. The inner member 71a is disposed to surround the entirety of the heater unit 7 below the outer end portion (and at a slightly outer side of the outer edge portion) of the turntable 2.

The bottom portion 14 of the vacuum chamber 1 closer to the rotation center than the space where the heater unit 7 is disposed protrudes upward to be close to the core unit 21 to form a projecting portion 12a. A narrow space is disposed between the projecting portion 12a and the core unit 21. Furthermore, a narrow space is disposed between an inner peripheral surface of the bottom portion 14 and the rotary shaft 22 to be in communication with the case body 20. A purge gas supplying pipe 72 which supplies Ar gas as the purge gas to the narrow space for purging is disposed in the case body 20. The bottom portion 14 of the vacuum chamber 1 includes a plurality of purge gas supplying pipes 73 (only one of the purge gas supplying pipes 73 is illustrated in FIG. 5) which are disposed at a predetermined angle interval in the circumferential direction below the heater unit 7 for purging the space where the heater unit 7 is disposed. Moreover, a cover member 7a is disposed between the heater unit 7 and the turntable 2 to prevent the gas from going into the space where the heater unit 7 is disposed. The cover member 7a is disposed to extend from an inner peripheral wall (upper surface of the inner member 71a) of the outer member 71b to an upper end portion of the projecting portion 12a in the circumferential direction. The cover member 7a may be made of quartz, for example.

The film deposition apparatus 1 further includes a separation gas supplying pipe 51 that is connected to a center portion of the ceiling plate 11 of the vacuum chamber 1 and is disposed to supply Ar gas as the separation gas to a space 52 between the ceiling plate 11 and the core unit 21. The separation gas supplied to the space 52 flows through a narrow space between the protruding portion 5 and the turntable 2 so as to flow along the top surface of the turntable 2 where the wafers W are to be placed and is discharged toward the outer periphery. The space 50 is kept at a pressure higher than those of the space 481 and the space 482 by the separation gas. Thus, the mixing of the source gas supplied to the first process region P1 and the nitriding gas supplied to the second process region P2 by flowing through the center area C can be prevented by the space 50. It means that the space 50 (or the center area C) can function similarly to the separation space H (or the separation region D).

In addition, as illustrated in FIGS. 2 and 3, a transfer port 15 is formed in a side wall of the vacuum chamber 1 for allowing the wafers W, which are substrates, to pass between an external transfer arm 9 and the turntable 2. The transfer port 15 is opened and closed by a gate valve (not illustrated in the drawings). Furthermore, lift pins, which penetrate through the concave portion 24 to lift up the wafer W from a backside surface, and a lifting mechanism for the lift pins (both are not illustrated in the drawings) are provided at a location where the wafer W is transferred and below the turntable 2 because the wafer W is transferred between the external transfer arm 9 and the concave portion 24 of the turntable 2, which is a substrate receiving area, at a location facing the transfer port 15.

Figure 6:
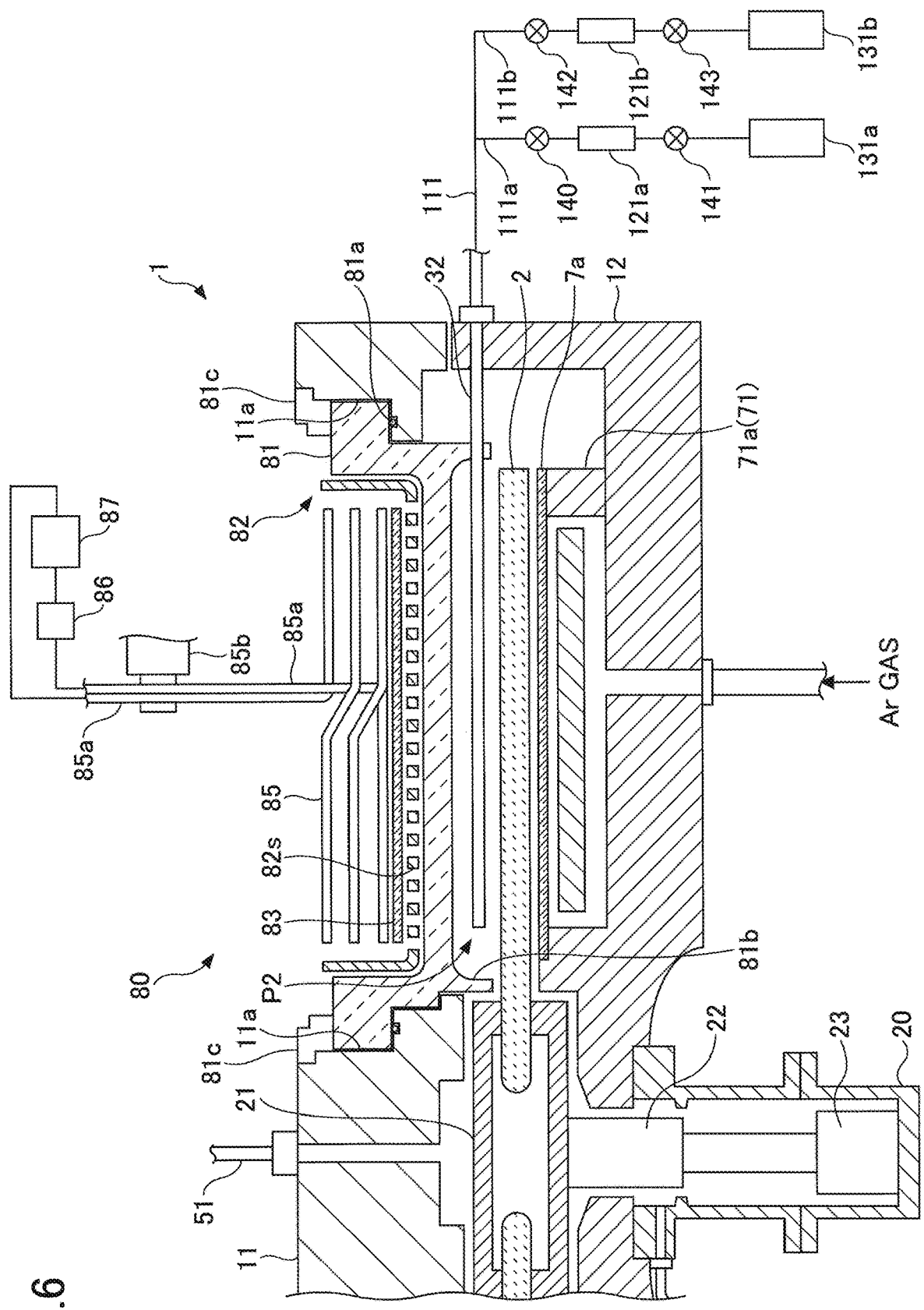
FIG. 6 is a schematic cross-sectional view of a plasma generator provided in a film deposition apparatus according to an embodiment of the present disclosure.
Figure 7:
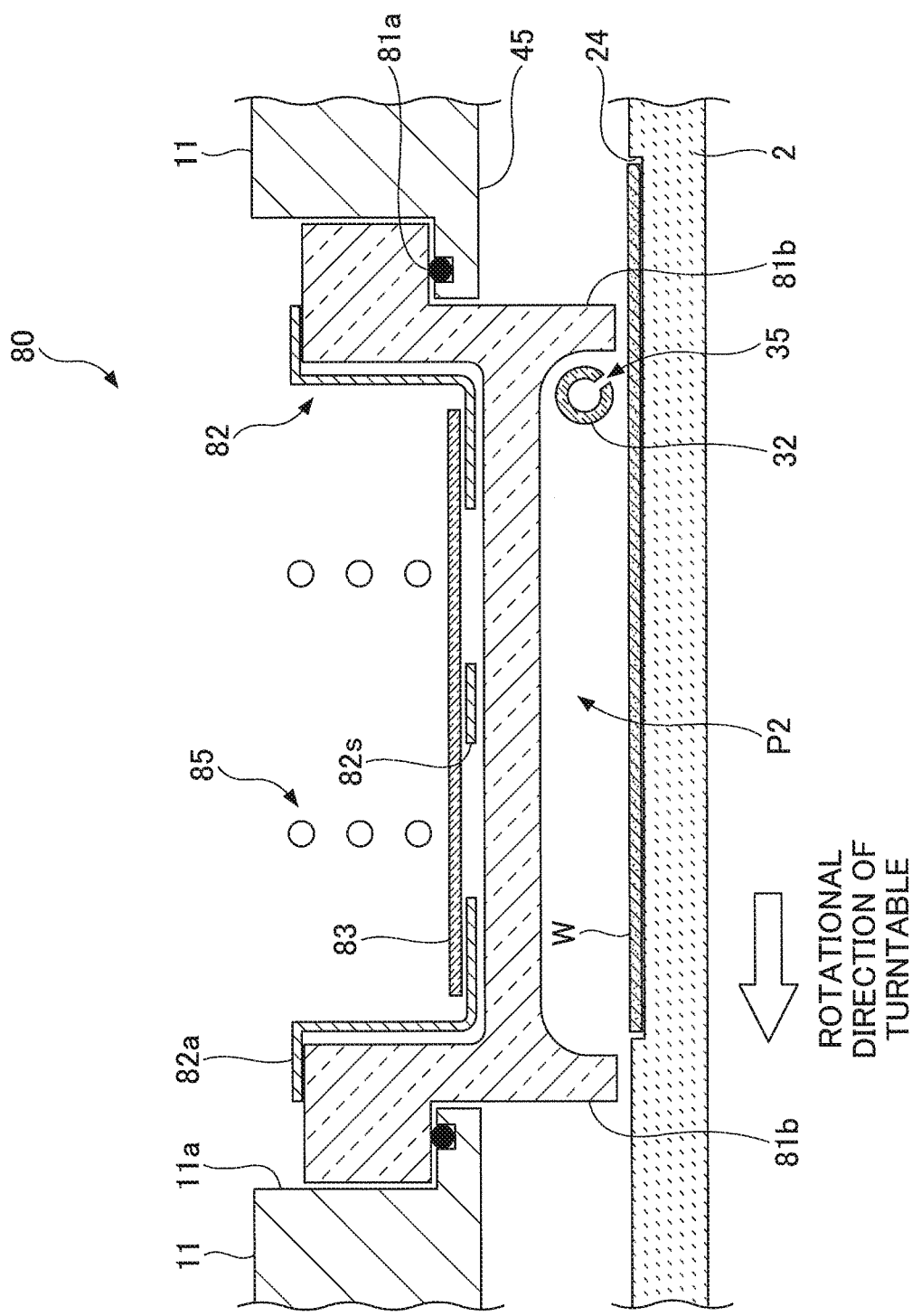
FIG. 7 is another schematic cross-sectional view of a plasma generator according to an embodiment of the present disclosure.
Figure 8:
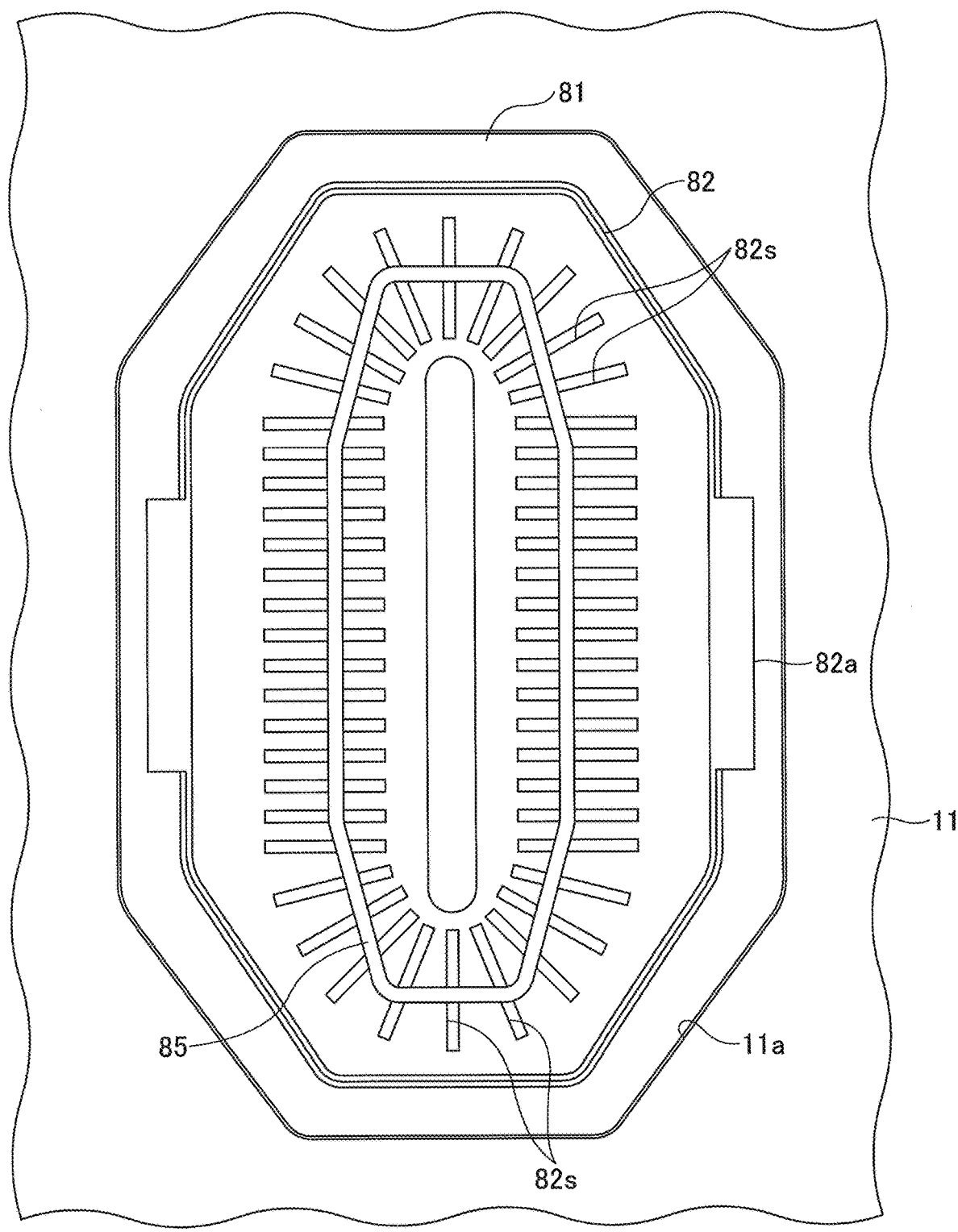
FIG. 8 is a schematic top view of a plasma generator according to an embodiment of the present disclosure.

Next, the plasma generator 80 is described below with reference to FIGS. 6 through 8. FIG. 6 is a schematic cross-sectional view of the plasma generator 80 taken along the radial direction of the turntable 2. FIG. 7 is a schematic cross-sectional view of the plasma generator 80 taken along a direction perpendicular to the radial direction of the turntable 2. FIG. 8 is a schematic top view illustrating the plasma generator 80. For an explanatory purpose, parts of the components are not illustrated in the drawings.

Referring to FIG. 6, the plasma generator 80 is made of a material that transmits radio frequency waves, and has a concave portion in its upper surface. The plasma generator 80 further includes a frame member 81 that is embedded in an opening 11a provided in the ceiling plate 11, a Faraday shield plate 82 housed in the concave portion of the frame member 81 and having substantially a box shape whose top is opened, an insulating plate 83 placed on a bottom surface of the Faraday shield plate 82, and a coil antenna 85 supported by the insulating plate 83 thereon. The antenna 85 has substantially an octagonal planar shape.

The opening 11a of the ceiling plate 11 is formed to have a plurality of step portions, and one of the step portions has a groove portion to extend along the perimeter where a sealing member 81a such as an O-ring or the like is embedded. The frame member 81 is formed to have a plurality of step portions that correspond to the step portions of the opening 11a, and when the frame member 81 is engaged in the opening 11a, a back side surface of one of the step portions contacts the sealing member 81a embedded in the opening 11a so that the ceiling plate 11 and the frame member 81 are kept in an air-tight manner. Moreover, as illustrated in FIG. 6, a pushing member 81c, which extends along the outer periphery of the frame member 81 that is fitted in the opening 11a of the ceiling plate 11, is disposed so that the frame member 81 is pushed downward with respect to the ceiling plate 11. Thus, the ceiling plate 11 and the frame member 81 are further kept in an air-tight manner.

The lower surface of the frame member 81 is positioned to face the turntable 2 in the vacuum chamber 1 and a projection portion 81b that projects downward (toward the turntable 2) is provided at the perimeter at the lower surface. The lower surface of the projection portion 81b is close to the surface of the turntable 2 and a space (hereinafter referred to as the third process region P3) is surrounded by the projection portion 81b, the surface of the turntable 2 and the lower surface of the frame member 81 above the turntable 2. The space between the lower surface of the projection portion 81b and the surface of the turntable 2 may be the same as the height h1 between the ceiling surface 44 and the upper surface of the turntable 2 in the separation space H (FIG. 4).

Further, the reaction gas nozzle 32 extending through the protruding portion 81b extends in the second process region P2. In this embodiment, an ammonia gas supply source 131a filled with ammonia gas is connected to the reaction gas nozzle 32 by pipes 111a and 111 through a flow controller 121a, as shown in FIG. 6. Similarly, a nitrogen gas supply source 131b filled with nitrogen gas is connected to the reaction gas nozzle 32 in parallel by pipes 111b and 111 via a flow controller 121b. Ammonia gas is used to deposit the film up to most of the depression pattern, such as a trench. Nitrogen gas, on the other hand, is used to block the space formed near the center of the depression pattern, while inhibiting the generation of a seam, at the final stage of filling or at each depth level. Thus, the supply of ammonia gas and the supply of nitrogen gas are switched by opening and closing valves 140 to 144. Specifically, when ammonia gas is supplied to the reaction gas nozzle 32, the valves 140 and 141 are opened and the valves 142 and 143 are closed. Conversely, when nitrogen gas is supplied to the reaction gas nozzle 32, the valves 142 and 143 are opened and the valves 140 and 141 are closed. The ammonia gas at a flow rate controlled by the flow controller 121a or the nitrogen gas at a flow rate controlled by the flow rate controller 121b is then converted to plasma by the plasma generator 80 and supplied to the second process region P2 at a predetermined flow rate.

Further, a plurality of discharge holes 35 is formed in the reaction gas nozzle 32 at a predetermined interval (for example, 10 mm) along the lengthwise direction thereof, and the above-described chlorine gas is discharged from the discharge hole 35. As illustrated in FIG. 7, the discharge holes 35 are inclined from a direction perpendicular to the turntable 2 toward the upstream side of the rotational direction of the turntable 2. Accordingly, the gas supplied from the reaction gas nozzle 32 is discharged in the direction opposite to the rotational direction of the turntable 2, more specifically, toward the gap between the lower surface of the protruding portion 81b and the surface of the turntable 2. This prevents the reaction gas or separation gas from flowing into the second process region P2 from the space below the ceiling surface 45 located upstream of the plasma generator 80 along the rotational direction of the turntable 2. Further, as described above, because the protrusion portion 81b formed along the outer periphery of the lower surface of the frame member 81 is adjacent to the surface of the turntable 2, the pressure in the second process region P2 can be readily kept high by the nitride gas from the reaction gas nozzle 32. This also prevents reaction and separation gases from flowing into the second process region P2.

The Faraday shield plate 82 is made of a conductive material such as a metal and is grounded, although not illustrated in the drawings. As clearly illustrated in FIG. 8, the Faraday shield plate 82 has a plurality of slits 82s at its bottom portion. Each of the slits 82s extends substantially perpendicularly to a corresponding side of the antenna 85 that has the substantially octagonal planar shape.

As illustrated in FIGS. 7 and 8, the Faraday shield plate 82 includes two support portions 82a that are disposed at upper end portions to bend outward. The support portions 82a are supported by the upper surface of the frame member 81 so that the Faraday shield plate 82 is supported at a predetermined position in the frame member 81.

The insulating plate 83 is made of fused quartz, for example, has a size slightly smaller than that of the bottom surface of the Faraday shield plate 82, and is mounted on the bottom surface of the Faraday shield plate 82. The insulating plate 83 insulates the Faraday shield plate 82 from the antenna 85 while passing the radio frequency waves radiated from the antenna 85 downward.

The antenna 85 is formed by winding a pipe made of copper three times, for example, in a substantially octagonal planar shape. Thus, cooling water can be circulated in the pipe, and the antenna 85 is prevented from being heated to a high temperature by the radio frequency waves supplied to the antenna 85. As illustrated in FIG. 6, the antenna 85 includes a standing portion 85a to which a support portion 85b is attached. The antenna 85 is maintained at a predetermined position in the Faraday shield plate 82 by the support portion 85b. The radio frequency power source 87 is connected to the support portion 85b via the matching box 86. The radio frequency power source 87 is capable of generating radio frequency power having a frequency of 13.56 MHz, for example.

According to the plasma generator 80 thus structured, when the radio frequency power source 87 supplies the radio frequency power to the antenna 85 via the matching box 86, the antenna 85 generates an electromagnetic field. In the electromagnetic field, the Faraday shield plate 82 cuts the electric field component so as not to transmit the electric field component downward. On the other hand, the magnetic field component propagates through a plurality of slits 82s of the Faraday shield plate 82 is into the second process region P2. The magnetic field component activates the nitriding gas supplied from the reaction gas nozzle 32 to the second process region P2.

Next, a remote plasma generator 90 will be described.

Figure 9:
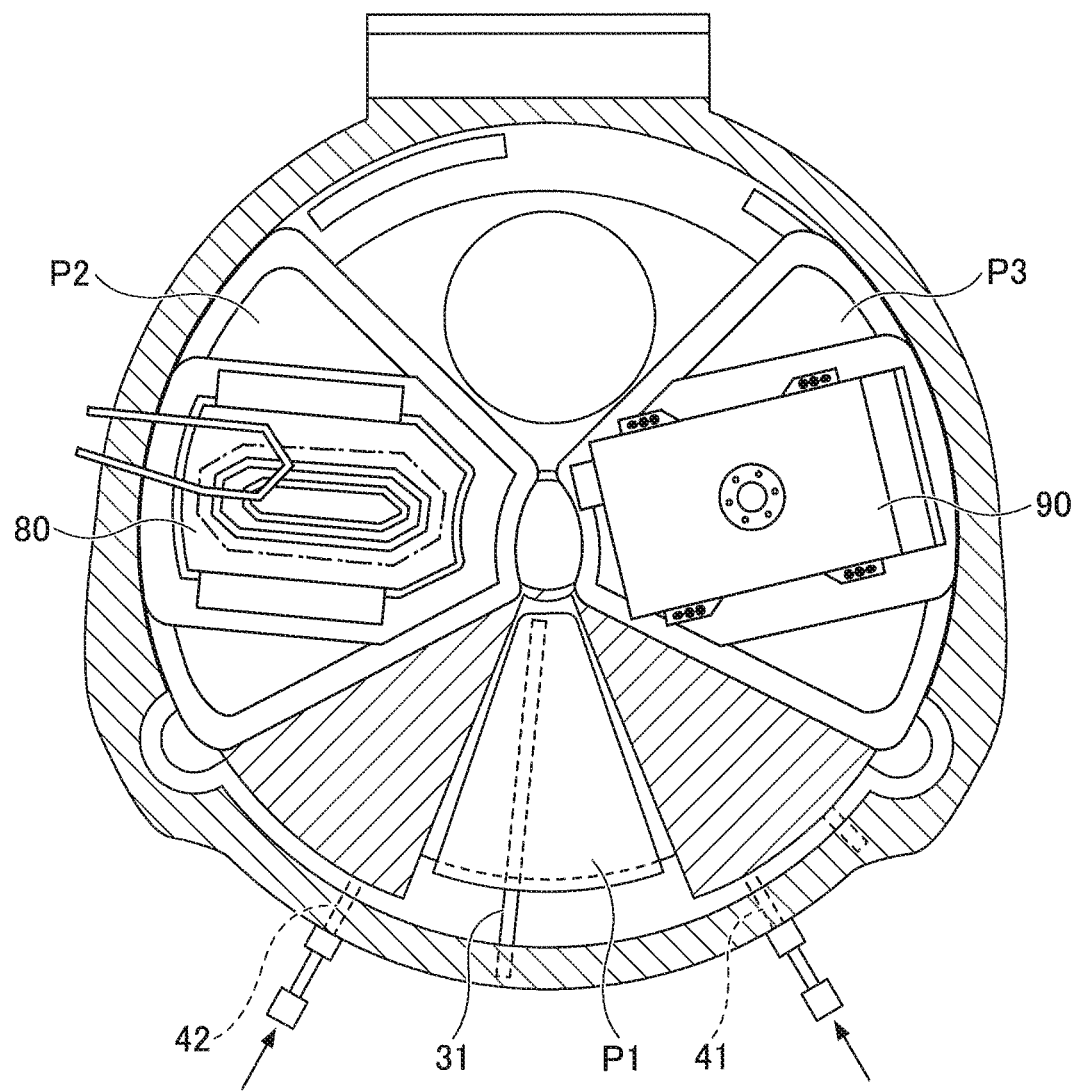
FIG. 9 is a plan view illustrating an example of a film deposition apparatus according to an embodiment of the present disclosure.

FIG. 9 is a diagram illustrating an example of a film deposition apparatus according to the present embodiment in which the plasma generators 80 and 90 are mounted. As illustrated in FIG. 9, the film deposition apparatus according to the present embodiment includes an ICP plasma (inductively-coupled plasma) generator 80 in the second process region P2, and a remote plasma generator 90 in the third process region P3.

Intense plasma of chlorine gas may etch a thin film. While the ICP plasma generator 80 using the antenna 85 described in FIGS. 6 to 8 is efficient in generating plasma at high plasma intensity, the activation of chlorine may employ a plasma generator to the extent that it generates radicals that are less active than the plasma. The remote plasma generator 90 is suitable for generating plasma that is weaker than that of the ICP plasma generator 80. Accordingly, in the film deposition apparatus according to the present embodiment, an example in which the activation of chlorine gas in the third process region P3 is performed by the remote plasma generator 90 will be described.

Figure 10:
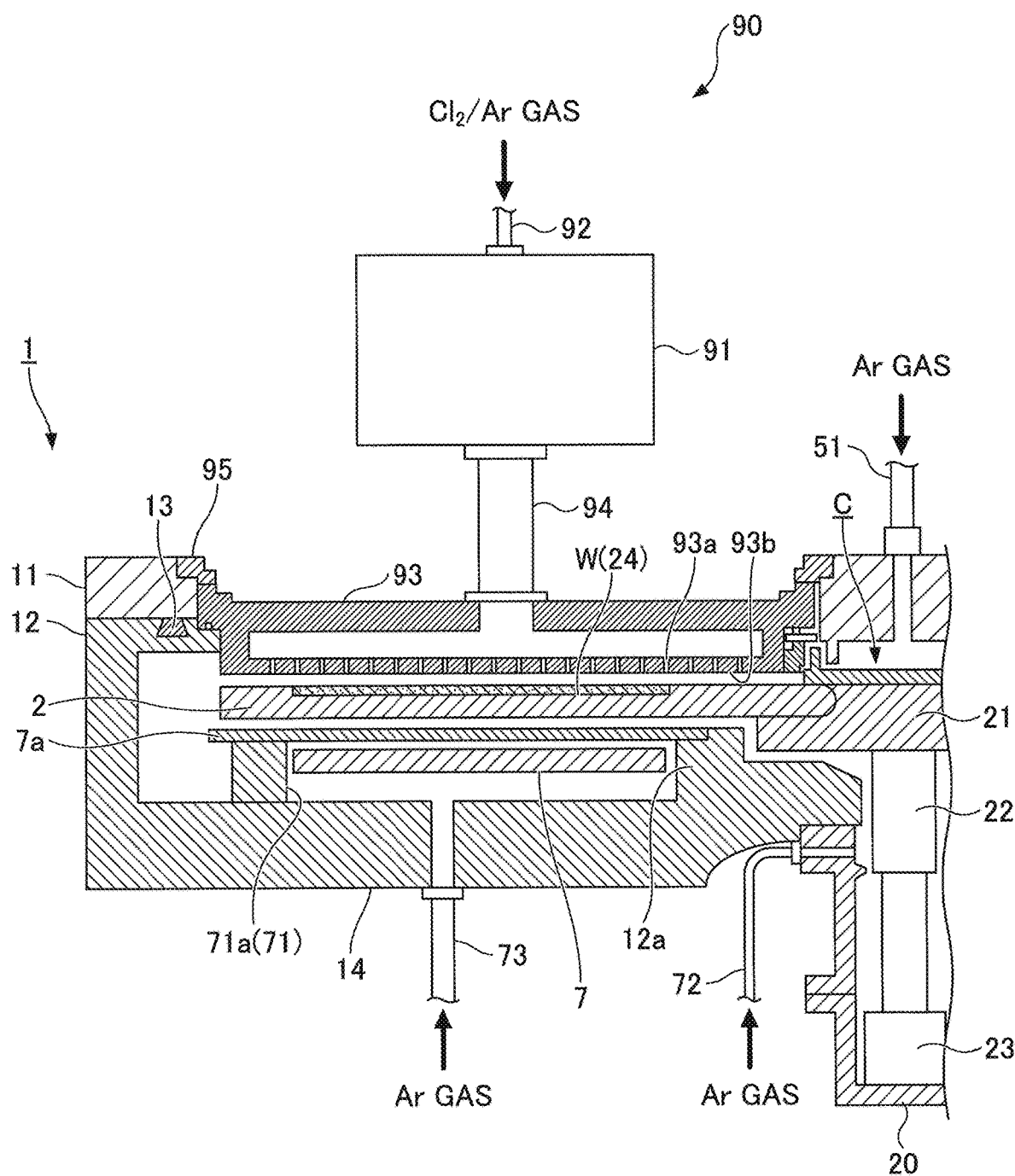
FIG. 10 is a partial cross-sectional view illustrating a third process region P3 in a film deposition apparatus according to an embodiment of the present disclosure.

FIG. 10 is a cross-sectional view of a film deposition apparatus including a plasma generator according to an embodiment.

As illustrated in FIG. 10, the plasma generator 90 is disposed opposite to the turntable 2 in the third process region P3. The plasma generator 90 includes a plasma generation part 91, a gas supply pipe 92, a showerhead part 93, and a pipe 94. Here, the showerhead part 93 is an example of a chlorine gas discharge part, and for example, a gas nozzle may be used instead of the showerhead part 93.

The plasma generation part 91 activates chlorine gas supplied from the gas supply pipe 92 using a plasma source. The plasma source is not particularly limited as long as it is capable of activating chlorine gas to generate chlorine radicals. For example, an inductively coupled plasma (ICP), a capacitively coupled plasma (CCP), or a surface wave plasma (SWP) may be used as the plasma source.

The gas supply pipe 92 has one end that is connected to the plasma generation part 91 to supply chlorine gas to the plasma generation part 91. The other end of the gas supply pipe 92 is connected to the chlorine gas supply source 132 that stores chlorine gas via an on-off valve and a flow controller 122, for example.

The showerhead part 93 is connected to the plasma generation part 91 via the pipe 94. The showerhead part 93 supplies chlorine gas that has been activated by the plasma generation part 91 into the vacuum chamber 1. The showerhead part 93 has a fan-like shape in a planar view and is pressed downward along the circumferential direction by a press member 95 that is formed along the outer edge of the fan-like shape. The press member 95 is fixed to the ceiling plate 11 by a bolt or the like (not illustrated), and in this way, the internal atmosphere of the vacuum chamber 1 may be maintained airtight. The distance between a bottom surface of the showerhead part 93 when it is secured to the ceiling plate 11 and a surface of the turntable 2 may be arranged to be about 0.5 mm to about 5 mm, for example.

A plurality of gas discharge holes 93a are arranged at the showerhead part 93. In view of the difference in speed on a rotational center side and an outer peripheral side of the turntable 2, fewer gas discharge holes 93a are arranged on the rotational center side of the showerhead part 93, and more gas discharge holes 93a are arranged on the outer peripheral side of the showerhead part 93. The total number of the gas discharge holes 93a may be several tens to several hundreds, for example. Also, the diameter of the plurality of gas discharge holes 93a may be about 0.5 mm to about 3 mm, for example. Activated chlorine gas supplied to the showerhead part 93 is supplied to the space between the turntable 2 and the showerhead part 93 via the gas discharge holes 93a.

Figure 11:
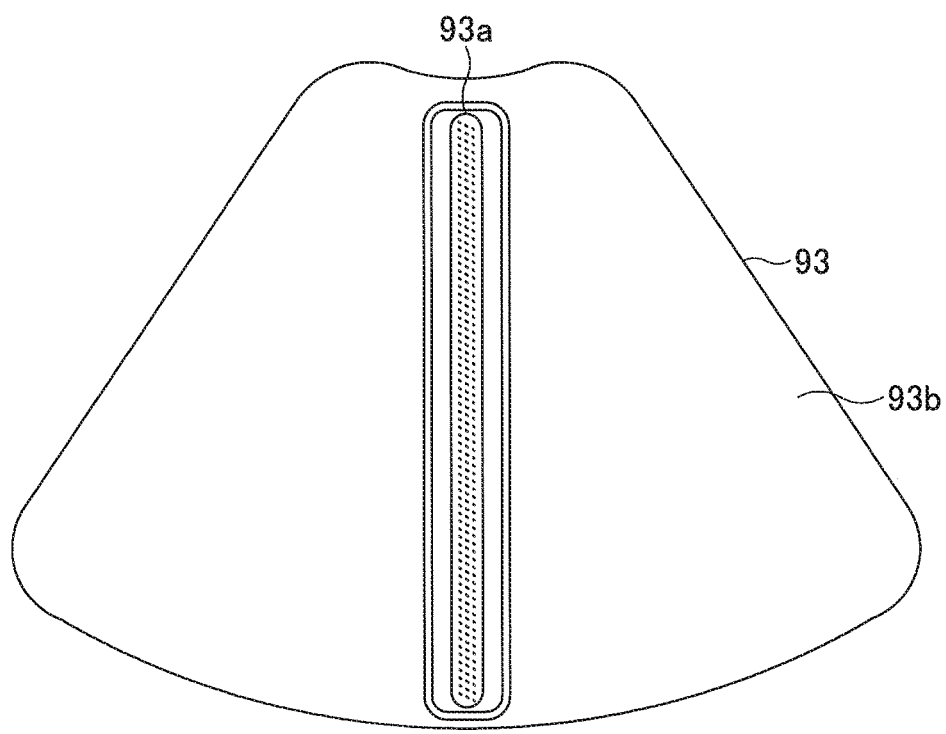
FIG. 11 is a plan view illustrating an example of a lower surface of a showerhead portion.

FIG. 11 is a planar view illustrating an example of a lower surface of the showerhead part 93. As illustrated in FIG. 11, the gas discharge holes 93a may be disposed at the center of the lower surface 93b of the showerhead part 93 in the circumferential direction so as to extend in the radial direction. Thus, chlorine gas can be supplied in a dispersed manner from the central side throughout the outer peripheral side of the turntable 2.

In this manner, a remote plasma generator 90 may be used to supply the chlorine radicals to the wafer W. It should be noted that providing the remote plasma generator 90 to supply chlorine radicals is not mandatory, and the remote plasma generator 90 may be provided as necessary. That is, for example, if the adsorption inhibiting effect required without radicalizing chlorine gas is obtained as is, the remote plasma generator 90 does not have to be provided, and chlorine gas may be supplied as is from a gas nozzle or the showerhead 93.

As illustrated in FIG. 1, the film deposition apparatus according to the present embodiment further includes a controller 100 that is constituted of a computer and controls the entirety of the film deposition apparatus. A memory in the controller 100 stores a program by which the film deposition apparatus executes the film deposition method (as will be described below) under a control of the control unit 100. The program is formed to include steps capable of executing the film deposition method, and is stored in a medium 102 such as a hard disk, a compact disc, a magneto-optic disk, a memory card, and a flexible disk. A predetermined reading device reads the program into a storage part 101, and the program is installed in the controller 100.

[Film Deposition Method]

Next, a method of depositing a silicon nitride film according to an embodiment of the present disclosure will be described. First, a difference between a method of depositing a silicon nitride film using ammonia and a method of forming a silicon nitride film using nitrogen will be described.

Figure 12:
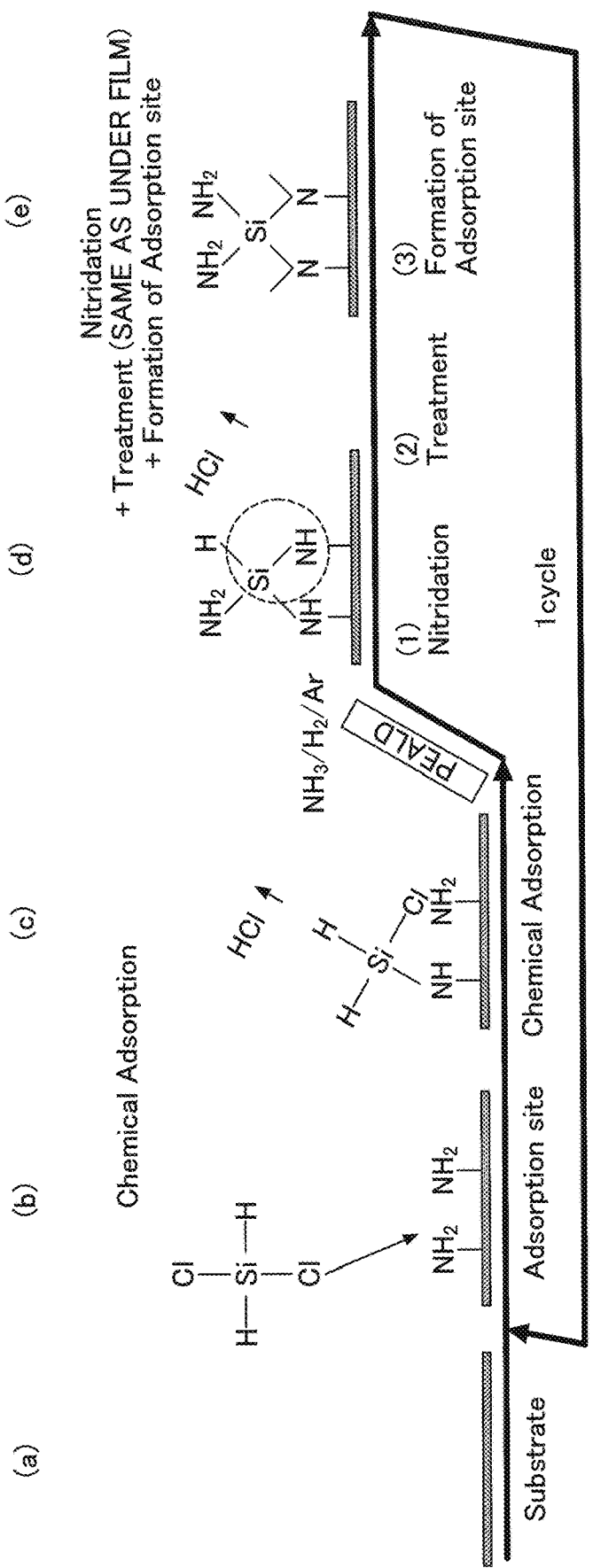
FIG. 12 is a diagram illustrating a method of depositing a silicon nitride film by nitriding using ammonia.

FIG. 12 is a diagram illustrating a method of depositing a silicon nitride film using ammonia.

FIG. 12(a) is a diagram illustrating a state in which a substrate is mounted.

FIG. 12(b) is a diagram illustrating a surface of a substrate nitrided with ammonia. As illustrated in FIG. 12(b), when the substrate is nitrided with ammonia, an $NH_2$ group (amino group) is formed on the surface of the substrate. The $NH_2$ group forms an adsorption site for silicon-containing gases because the NH$_2$ group forms an adsorption site for silicon. In FIG. 12, the case in which dichlorosilane (Dichlorosilane, SiH$_2$Cl$_2$) is used as the silicon-containing gas will be described as an example.

FIG. 12(c) is a diagram illustrating an example of a silicon-containing gas adsorption process. In the silicon-containing gas adsorption process, dichlorosilane is adsorbed on the NH$_2$ group by chemical adsorption. Since the NH$_2$ group forms an adsorption site for silicon-containing gases, the dichlorosilane adsorbs on the NH$_2$ group. Then, HCl is formed and released.

FIG. 12(d) is a diagram illustrating an example of a nitriding process using ammonia. Here, an example is illustrated in which dichlorosilane is nitrided by ammonia plasma using a mixed gas of ammonia, hydrogen and argon. The dichlorosilane adsorbed on the NH$_2$ group, which is the adsorption site, reacts with ammonia by supplying ammonia plasma to form silicon nitride. This deposits a silicon nitride film. At this time, HCl evaporates and is released. Because the nitriding at this time is caused by ammonia plasma, the silicon nitride film is modified at the same time, and an NH$_2$ group, which is an adsorption site, is formed on the surface.

FIG. 12(e) is a diagram illustrating an example of an adsorption site forming process. By supplying ammonia plasma, an adsorption site made of NH$_2$ groups is formed on the surface of the silicon nitride film.

Then, a silicon nitride film is deposited by repeating a cycle constituted of FIG. 12(b) to (e).

The above is a method for depositing a silicon nitride film used for filling a depression.

Figure 13:
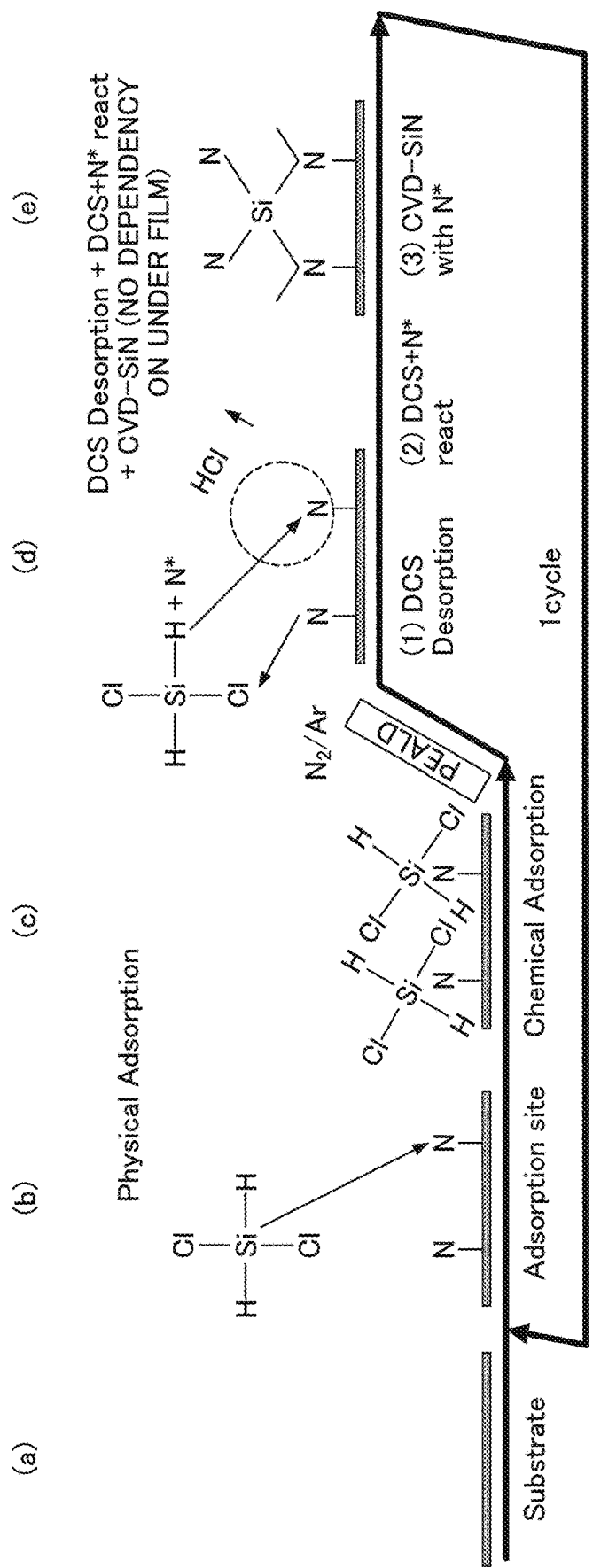
FIG. 13 is a diagram illustrating a method of depositing a silicon nitride film by nitriding using nitrogen.

FIG. 13 is a diagram illustrating a method for depositing a silicon nitride film using nitrogen.

FIG. 13(a) is a diagram illustrating a state in which a substrate is mounted.

FIG. 13(b) is a diagram illustrating a surface of a substrate nitrided by nitrogen. As illustrated in FIG. 13(b), when the substrate is nitrided using nitrogen, N groups (nitrogen radicals) are formed on the surface of the substrate. The N groups do not form a chemical adsorption site for silicon, but form a site on which the silicon-containing gas can adsorb by physical adsorption. For example, it may be referred to as a physical adsorption capable site. In FIG. 13, the case in which dichlorosilane (Dichlorosilane, SiH$_2$Cl$_2$) is used as the silicon-containing gas is also described as an example. The physical adsorption sorption is based on van der Waals force, not based on chemical binding. The binding energy of the physical adsorption is lower than that of the chemical adsorption.

FIG. 13(c) is a diagram illustrating an example of a silicon-containing gas physical adsorption process. In the silicon-containing gas physical adsorption process, dichlorosilane is physically adsorbed on the N groups. Because the adsorption is a physical adsorption, unlike chemical bonding, the adsorption force is a degree that the adsorption is released if some energy is added.

FIG. 13(d) is a diagram illustrating an example of a nitriding process using nitrogen. Here, an example is illustrated in which dichlorosilane is nitrided by nitrogen plasma (nitrogen radical) using a mixture of nitrogen gas and argon gas. Dichlorosilane physically adsorbed on the N groups is blown off the N groups by the supply of nitrogen plasma. This causes the dichlorosilane to float.

FIG. 13(e) is a diagram illustrating an example of a silicon nitride film deposition process. Nitrogen plasma is continuously supplied to the floating dichlorosilane, and dichlorosilane and nitrogen plasma react with each other to deposit a silicon nitride film. The silicon nitride film is then deposited on the substrate. This reaction is not ALD but a reaction that occurs in the space above the substrate and is similar to CVD (Chemical Vapor Deposition). In the air, silicon nitride is formed as a reaction product, which is deposited on the substrate. If the trench, via, or other depression pattern is filled with a silicon nitride film by ALD, because the thin film is gradually deposited (grows) from the side wall toward the center, a seam is inevitably generated when the opposing thin films finally join together at the center. However, in the case of a CVD reaction, rather than growth from the sidewalls, the reaction occurs in the air and falls, and the growth of the thin film is not directed to a specific direction, and the thin film is formed in the space and is deposited in the space. Accordingly, because the thin film does not act as connections and only deposit from top to bottom, the thin film can be deposited while suppressing the generation of the seams. Accordingly, such deposition can be used in the final stage of depositing the thin film into the depression pattern to fill the depression to the end while inhibiting the generation of the seam.

Thus, the film deposition using nitrogen is a very suitable method for seamless deposition. The silicon nitride film is deposited by repeating a cycle constituted of FIG. 13(b) to (e).

The above is a method for depositing a silicon nitride film used in the final step of finishing filling of the depression.

A method of forming a silicon nitride film according to the present embodiment is performed by combining silicon nitride film deposition using ammonia with silicon nitride film deposition using nitrogen.

Figure 14:
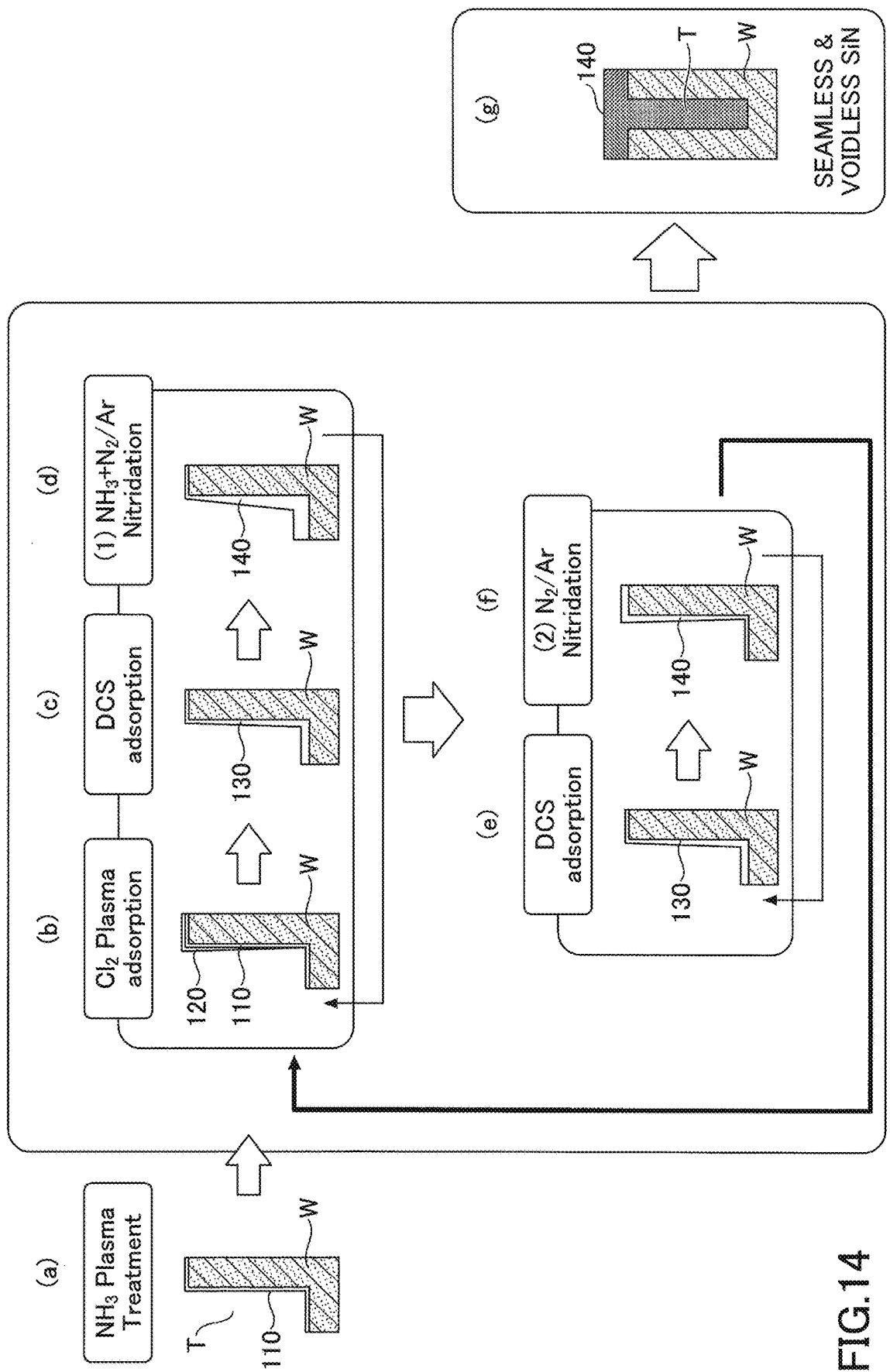
FIG. 14 is a diagram illustrating a series of steps of an example of a method for depositing a silicon nitride film according to an embodiment of the present disclosure.

FIG. 14 is a diagram illustrating a series of steps of an example of a method for depositing a silicon nitride film according to an embodiment of the present disclosure. In this embodiment, a silicon wafer is used as the wafer W, and the silicon wafer has a trench T formed as illustrated in FIG. 14(a).

An example of supplying dichlorosilane (DCS, SiH$_2$Cl$_2$) as a silicon-containing gas from the reaction gas nozzle 31, supplying ammonia (NH$_3$) as a nitriding gas from the reaction gas nozzle 32, and supplying chlorine (Cl$_2$) gas from the showerhead 93 will be described. In the example, the plasma generators 80, 90 are mounted, and both ammonia gas and chlorine gas are activated, and are supplied as ammonia plasma and chlorine radicals.

First, a gate valve (not illustrated in the drawings) is opened, and the transfer arm 10 (FIG. 3) transfers the wafer W from the outside to the concave portion 24 of the turntable 2 via the transfer port 15 (FIG. 2 and FIG. 3). This transfer is performed by raising and lowering the lift pins (not illustrated in the drawings) via through holes provided in the bottom surface of the concave portion 24 from the bottom portion side of the vacuum chamber 1 when the concave portion 24 stops at a position facing the transfer port 15. By repeating such a wafer transfer while intermittently rotating the turntable 2, the wafers W are loaded into the respective concave portions 24.

Then, the gate valve is closed, and the vacuum pump 640 evacuates the vacuum chamber 1 to the attainable degree of vacuum. Then, the separation gas nozzles 41 and 42 discharges Ar gas as a separation gas at a predetermined flow rate. At this time, the separation gas supplying pipe 51 and the purge gas supplying pipes 72 and 73 also discharge Ar gas at a predetermined flow rate, respectively. With this, the pressure regulator 650 (FIG. 1) controls the vacuum chamber 1 to a preset processing pressure. Then, the heater unit 7 heats the wafers W to 400° C., for example, while the turntable 2 is rotated in a clockwise direction at a rotational speed of 5 rpm, for example. The rotational speed of the turntable 2 can be set at a variety of rotational speeds depending on the intended purpose. Also, the plasma generators 80 and 80a are turned on.

FIG. 14(a) is a diagram illustrating an example of an ammonia plasma nitriding process. First, ammonia gas is supplied from the reaction gas nozzle 32 to generate ammonia plasma at the plasma generator 80. Thus, the trench T is nitride, and an $NH_2$ group 110 is formed on the surface. The $NH_2$ group becomes an adsorption site for dichlorosilane.

FIG. 14(b) is a diagram illustrating an example of an adsorption inhibiting region forming step. After the ammonia plasma nitriding step, the chlorine radical is supplied from the showerhead 93. The chlorine radical is generated by a remote plasma generator 90. By rotating the turntable 2, the wafer W passes through the third process region P3, where chlorine radicals are supplied on the $NH_2$ group 110 in the trench T. The chlorine radicals react with an H group to form HCl, and replace an H group to form a Cl group termination. Such a Cl group serves as adsorption inhibiting groups for chlorine-containing gases to form an adsorption inhibiting regions 120. Here, the chlorine radicals readily reach the top surface S of the wafer W, the upper portion of the trench T, but often does not reach the bottom portion of the trench T, i.e., the location near the bottom. Because of the high aspect ratio of the trench T, many chlorine radicals replace the H groups before reaching the depth of trench T. Accordingly, Cl groups, which are an adsorption inhibitor, are formed at high density at the top surface S of the wafer W and the upper portion of the trench T, and an adsorption inhibiting region 120 is formed. However, many H groups of the $NH_2$ structure remain at the bottom of the trench T, and the density of Cl groups is reduced.

FIG. 14(c) is a diagram illustrating an example of a source gas adsorption process. As illustrated in FIG. 14(c), after the wafer W passes through the separation region D and is purged, dichlorosilane 130 is supplied to the wafer W while the wafer W passes through the first process region P1. Dichlorosilane 130 scarcely adsorb on the adsorption inhibiting region 120 on which the adsorption inhibiting group Cl is present, and dichlorosilane 130 adsorbs more on a region other than the adsorption inhibiting region 120. Accordingly, most of dichlorosilane 130 adsorbs near the bottom surface of the trench T, and dichlorosilane 130 scarcely adsorb on the top surface S of the wafer W and the upper portion of the trench T. That is, dichlorosilane 130, a source gas, adsorbs at high density near the bottom of the trench T, and dichlorosilane 130 adsorbs at low density on the top surface of the wafer W and the upper portion of the trench T.

FIG. 14(d) is a diagram illustrating an example of a silicon nitride film deposition process. As illustrated in FIG. 14(d), after the wafer W passes through the separation region D and is purged, ammonia plasma is supplied to the wafer W while the wafer W passes through the second process region P2. Here, ammonia gas may be supplied as a mixed gas including, for example, ammonia, nitrogen and argon. By supplying ammonia plasma, dichlorosilane 130 adsorbed on the trench T reacts with the supplied ammonia plasma, and form a molecular layer of a silicon nitride film as a reaction product. Here, because dichlorosilane 130 significantly adsorbs on a location near the bottom of the trench T, a silicon nitride film is significantly formed on the location near the bottom of the trench T. Accordingly, the filling deposition with a high bottom-up property can be performed as illustrated in FIG. 14(d).

Then, as the wafer W passes through the third process region P3 by rotation of the turntable 2, the wafer W again enters the state illustrated in FIG. 14(b), wherein the Cl group, which is an adsorption inhibitor, adsorbs on the upper portion of the trench T and the top surface of the wafer W, and forms an adsorption inhibiting region 120.

Hereinafter, by repeatedly rotating the turntable 2 while supplying each reaction gas, the cycle illustrated in FIGS. 14b to 14d is replaced, and a silicon nitride film is deposited from the bottom side without blocking the opening of the trench T. Then, as illustrated in FIG. 14(d), while forming a V-shaped cross section, a film of silicon nitride film 140 is deposited with a high bottom-up property without blocking the opening. This enables filling deposition of a high quality silicon nitride film 140 without generating a void and the like.

Thus, according to the film deposition method according to an embodiment of the present invention, by supplying a chlorine radical to the upper portion of the trench T to form an adsorption inhibiting region 120 while using an ALD (Atomic Layer Deposition) method, selective film deposition with a high bottom-up property can be performed.

$NH_3$ does not necessarily need to be activated and to be supplied by plasma, and may be supplied without being activated by plasma if nitriding is possible.

In the present embodiment, in FIG. 14(a), the surface S of the wafer W and the inner surface of the trench T are nitrided by ammonia plasma to form the adsorption site 110. However, in the case where the silicon nitride film and the silicon oxide film are formed as an undercoating film from the beginning, the adsorption inhibiting region forming step of FIG. 14(b) may be started without performing the nitriding step of FIG. 14(a).

The cycle is repeated using the steps of FIGS. 14(b)-(d) as one cycle, and the silicon nitride film is deposited in the trench T while forming a V-shape. This causes the silicon nitride film to be deposited and to grow from the side wall toward the center of the trench T and from the bottom to the top.

When the center space in the trench T becomes very small at the final stage of the filling deposition, the space filling processes of FIGS. 14(e) and (f) are performed. When the space filling process is performed, the supply of chlorine radical from the showerhead 93 is stopped. Moreover, the gas supplied from the reaction gas nozzle 32 is switched from ammonia gas to nitrogen gas. Specifically, the supply from the ammonia gas supply source 131a is switched to the nitrogen gas supply source 131b. Switching can be performed by closing the valves 140, 141 and by opening the valves 142, 143 when the valves 140, 141 are open and the valves 142, 143 are closed.

FIG. 14(e) is a diagram illustrating an example of a silicon-containing gas adsorption process. In the silicon-containing gas adsorption process, dichlorosilane 130 is supplied to the first process region P1 as illustrated in FIG. 14(c) and adsorbs on the surface of the silicon nitride film 140.

FIG. 14(f) is a diagram illustrating an example of a nitrogen plasma nitriding process. In the nitrogen plasma nitriding process, dichlorosilane 130 is nitrided by nitrogen plasma to deposit the silicon nitride film 140. Here, as described in FIG. 13, in the case of nitriding using nitrogen plasma, an N group is formed on the surface of the silicon nitride film.

Next, the processes in FIGS. 14(e) and (f) are made one cycle, and this cycle is repeated multiple times. In the second silicon-containing gas adsorption process, dichlorosilane is physically adsorbed on the N group. Accordingly, in the second nitrogen plasma nitriding process, dichlorosilane is blown off by the nitrogen plasma, and the dichlorosilane reacts with the nitrogen plasma with the dichlorosilane floating in the center space, and the silicon nitride formed in the floating state is deposited on the silicon nitride film 140, thereby filling the space. Accordingly, silicon nitride generated by CVD is deposited in the space, rather than growth from the lateral side. As a result, a seam formed by the joints between walls is not formed, and the space can be seamlessly filled with the silicon nitride film.

The cycle of FIGS. 14(*e*) and (*f*) is carried out until the center space is filled. By performing such a two-step process, the film deposition is performed while maintaining the V-shaped cross-sectional shape and preventing the generation of void, and the central space can be closed by seamless film deposition in the final process, thereby achieving voidless, seamless, and high quality filling deposition.

FIG. 14(*g*) illustrates a state in which a trench T is fully filled with silicon nitride film 140. As illustrated in FIG. 14(*g*), the filing deposition of the silicon nitride film can be performed voidlessly and seamlessly.

The seamless film deposition of FIGS. 14(*e*) and 14(*f*) may be performed not only at the final stage of the film deposition into the trench T, but also in the middle of the film deposition of the trench T. For example, at each depth level, the seamless film deposition may be performed at the stage of closing the space in the center at that depth. That is, the depth of the trench T may be divided into a plurality of stages to perform seamless deposition of FIGS. 14(*e*) and 14(*f*) at the final stage of each depth.

In this embodiment, an example of filling deposition while maintaining the V-shape using chlorine radicals in an early stage has been described. However, if voidless film deposition is possible, the early stage of the film deposition may employ other film deposition methods.

Moreover, an example of using chlorine gas as the adsorption inhibiting gas and a gas containing silicon and chlorine as the silicon-containing gas has been described with regard to the filing film deposition in the early stage. However, the combination of gases capable of forming the adsorption inhibiting region 120 for the silicon-containing gas is not limited to the combination of the above-described embodiments. That is, in addition to the relationship between chlorine atoms, a combination of such repulsive elements may also include a variety of combinations of silicon-containing gases and adsorption inhibiting gases.

In the present embodiment, the adsorption inhibiting gas is described with reference to an example of supplying the adsorption inhibiting gas as the adsorption inhibiting radicals and the nitriding gas as plasma. However, the plasma generators 80 and 90 may not be necessarily used when the purpose of adsorption inhibition and nitriding can be achieved.

[Working Example]

Next, a result of a working example of performing the method of depositing the silicon nitride film according to the present embodiment will be described.

Figure 15:
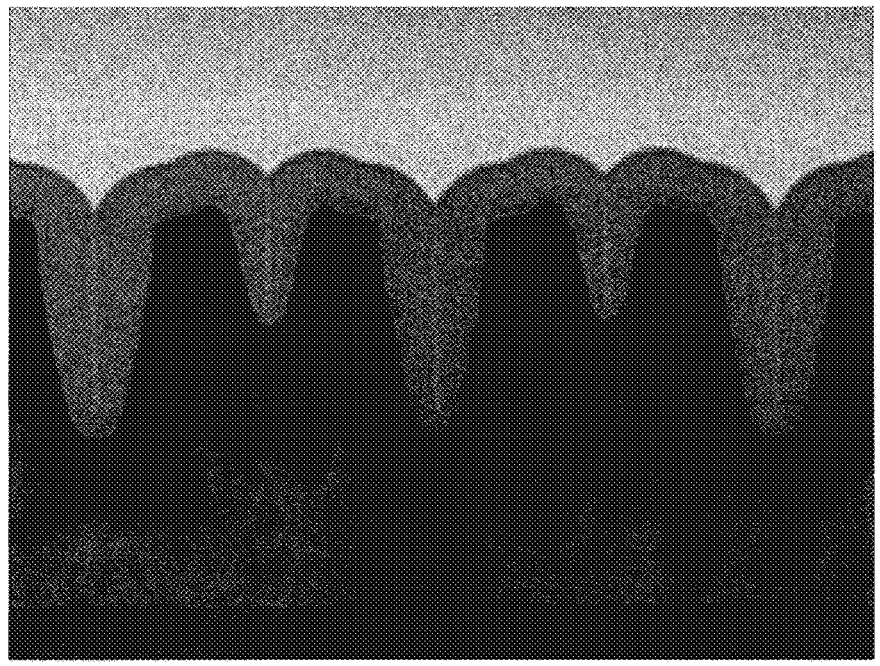
FIG. 15 is a diagram illustrating a result of film deposition according to a comparative example.

FIG. 15 is a picture showing a result of film deposition according to a comparative example in which the film is deposited to the end only by depositing a film while maintaining a V shape of the early stage. As shown in FIG. 15, the film deposition method of the comparative example shows that no void is generated, but seams are formed in the center of the films in the trenches.

Figure 16:
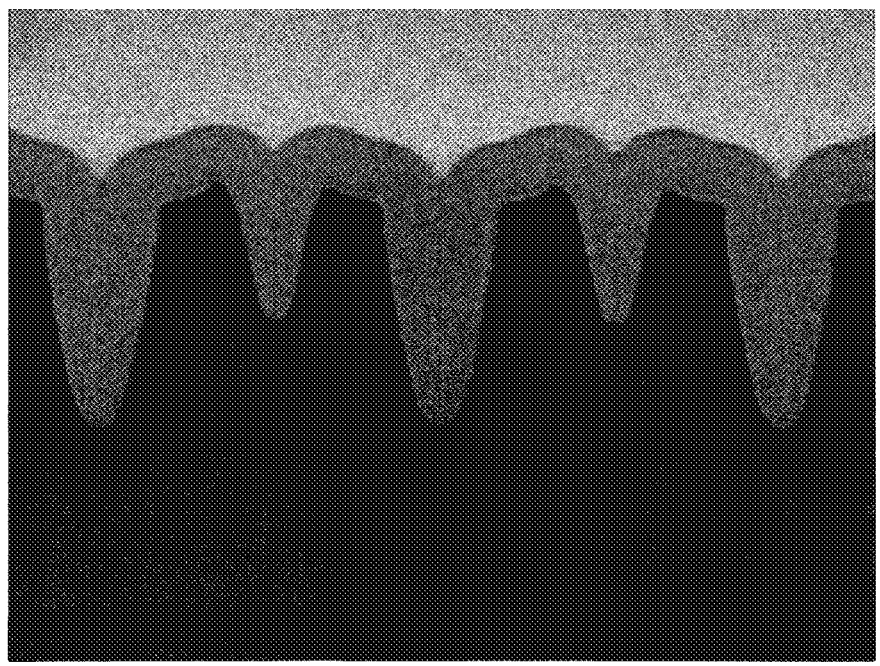
FIG. 16 is a diagram illustrating a result of film deposition according to an embodiment in which a film deposition method is performed according to the present embodiment.

FIG. 16 is a picture showing a result of the film deposition method according a working example of performing the film deposition method according to the present embodiment. As shown in FIG. 16, no void is generated, and the generation of the seams in the centers is much smaller than that in FIG. 15, which indicates that the deposited film is formed seamlessly.

Thus, the working example indicates that the method of depositing the silicon nitride film according to the present embodiment can perform the filling deposition of the silicon nitride film in a voidless and seamless manner.

Thus, as described above, according to the present disclosure, a depression can be filled with a silicon nitride film while inhibiting generation of a seam.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A method for depositing a silicon nitride film, comprising:
depositing a silicon nitride film by ALD in a depression formed in a surface of a substrate from a bottom surface and a lateral surface toward a center of the depression in a lateral direction so as to narrow a space at the center of the depression; wherein the silicon nitride film is deposited in the depression by: forming an adsorption inhibiting region in which a H group in an $NH_2$ group formed on a surface is replaced by a Cl group that inhibits adsorption of a silicon-containing gas that contains chlorine, on an upper portion in the depression by adsorbing a chlorine gas; adsorbing the silicon-containing gas on an $NH_2$ group on a region other than the adsorption inhibiting region in the depression by supplying the silicon-containing gas into the depression by chemical adsorption; and depositing a molecular layer of the silicon nitride film in which an $NH_2$ group is formed on a surface in the depression by supplying ammonia gas into the depression so as to cause the silicon-containing gas adsorbed on the depression to react with the ammonia gas, and periodically repeating: forming the adsorption inhibiting region on the upper portion in the depression; adsorbing the silicon-containing gas on the region other than the adsorption inhibiting region; and depositing the molecular layer of the silicon nitride film in the depression;
switching supply of nitriding gas from the ammonia gas to nitrogen gas at a final stage of filling the space at the center of the depression;
adsorbing a first nitrogen radical into the depression immediately before a stage of filling the space at the center with the silicon nitride film deposited toward the center of the depression;
adsorbing the silicon-containing gas on the first nitrogen radical in the depression by physical adsorption; and
supplying a second nitrogen radical into the depression so as to release the silicon-containing gas from the first nitrogen radical and to cause the released silicon-containing gas to react with the second nitrogen radical, thereby depositing a silicon nitride film by CVD to fill the space at the center.

2. The method for depositing the silicon nitride film according to claim 1, wherein adsorbing the silicon-containing gas by physical adsorption and depositing the silicon nitride film to fill the space are repeated, thereby completely filling the space at the center.

3. The method for depositing the silicon nitride film according to claim 1, wherein the ammonia gas is supplied as an ammonia plasma.

4. The method for depositing the silicon nitride film according to claim 3, wherein the chlorine gas is made of a chlorine radical.

5. The method for depositing the silicon nitride film according to claim 4,
   wherein the plasma for activating the chlorine gas to make the chlorine radical is remote plasma, and
   wherein the ammonia plasma, the first nitrogen radical, and the second nitrogen radical are generated using inductively coupled plasma.

6. The method for depositing the silicon nitride film according to claim 1,
   wherein depositing the silicon nitride film, switching supply of nitriding gas from the ammonia gas to nitrogen gas, adsorbing the first nitrogen radical into the depression, adsorbing the silicon-containing gas on the first nitrogen radical by physical adsorption, and supplying the second nitrogen radical into the depression are made a cycle, and the cycle is repeated multiple times depending on a depth range of the depression until filling up the depression.

* * * * *